(12) United States Patent
Yang et al.

(10) Patent No.: US 9,035,680 B2
(45) Date of Patent: May 19, 2015

(54) COMPARATOR AND ANALOG-TO-DIGITAL CONVERTER

(71) Applicant: Huawei Technologies Co., Ltd., Shenzhen, Guangdong (CN)

(72) Inventors: Jinda Yang, Shanghai (CN); Liren Zhou, Shanghai (CN); Jun Xiong, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/509,806

(22) Filed: Oct. 8, 2014

(65) Prior Publication Data

US 2015/0102952 A1    Apr. 16, 2015

(30) Foreign Application Priority Data

Oct. 11, 2013    (CN) .......................... 2013 1 0474179

(51) Int. Cl.
| | |
|---|---|
| *H03K 5/22* | (2006.01) |
| *H03M 1/38* | (2006.01) |
| *H03K 3/037* | (2006.01) |
| *H03K 3/012* | (2006.01) |
| *H03K 3/013* | (2006.01) |
| *H03M 1/00* | (2006.01) |
| *H03M 1/06* | (2006.01) |
| *H03M 1/12* | (2006.01) |
| *H03K 17/693* | (2006.01) |

(52) U.S. Cl.
CPC ................ *H03M 1/38* (2013.01); *H03K 3/037* (2013.01); *H03K 3/012* (2013.01); *H03K 3/013* (2013.01); *H03M 1/002* (2013.01); *H03M 1/0617* (2013.01); *H03M 1/124* (2013.01); *H03K 17/693* (2013.01)

(58) Field of Classification Search
CPC .............. H03K 5/2481; H03K 3/0375; H03K 3/356191; H03K 5/249; H03K 5/2472; H03K 3/35625; H03K 17/167; H03K 17/04106; H03K 5/151
USPC ........... 341/136, 155; 327/54, 55, 65, 67, 215
See application file for complete search history.

(56) References Cited

U.S. PATENT DOCUMENTS

| | | | | |
|---|---|---|---|---|
| 5,245,223 | A * | 9/1993 | Lim et al. | 327/80 |
| 5,479,170 | A * | 12/1995 | Cauwenberghs et al. | 341/200 |
| 5,539,339 | A * | 7/1996 | Van Rens | 327/51 |
| 6,114,882 | A * | 9/2000 | Flynn | 327/103 |
| 6,366,113 | B1 * | 4/2002 | Song | 326/24 |
| 7,119,612 | B1 * | 10/2006 | Holloway et al. | 330/9 |
| 8,305,247 | B2 * | 11/2012 | Pun et al. | 341/144 |
| 8,610,465 | B2 * | 12/2013 | Jansson | 327/63 |
| 2003/0094986 | A1 * | 5/2003 | Engl | 327/236 |

(Continued)

Primary Examiner — Linh Nguyen

(57) ABSTRACT

Embodiments of the present invention provide a comparator and an analog-to-digital converter. A sampling module, a pre-amplifying module, and a coupling module in the comparator obtain a third differential voltage signal according to a positive input signal and a negative reference signal, and obtain a fourth differential voltage signal according to a negative input signal and a positive reference signal. A latch that is in the comparator and formed by a first P-type field effect transistor, a second P-type field effect transistor, a third field effect transistor, a fourth field effect transistor, a first switch, and a second switch is directly cross-coupled through gates, and directly collects the third differential voltage signal and the fourth differential voltage signal to the gates, so as to drive the latch to start positive feedback.

13 Claims, 15 Drawing Sheets

(56) References Cited

U.S. PATENT DOCUMENTS

2004/0201420 A1* 10/2004 Liu .............................. 330/253
2006/0146958 A1* 7/2006 Doi .............................. 375/318
2008/0143440 A1* 6/2008 Yagi ............................. 330/257
2014/0176356 A1* 6/2014 Li ................................ 341/155

* cited by examiner

COMPARATOR AND ANALOG-TO-DIGITAL CONVERTER

CROSS-REFERENCE TO RELATED APPLICATION

This application claims priority to Chinese Patent Application No. 201310474179.X, filed on Oct. 11, 2013, which is hereby incorporated by reference in its entirety.

TECHNICAL FIELD

The present invention relates to the field of integrated circuit technologies, and in particular, to a comparator and an analog-to-digital converter.

BACKGROUND

In a communications base station, both a receive channel and a feedback channel generally require a high-speed and high-precision analog-to-digital converter (ADC, Analog-Digital Converter). A pipeline ADC is one of various existing ADC architectures.

In consideration of noise, power consumption, design difficulty, and the like, existing pipeline ADCs are increasingly prone to employ a structure without a sample-and-hold stage. As shown in FIG. 1, taking a stage 0 pipeline for example, it means that a sub-digital-to-analog converter (MDAC0) and a sub-analog-to-digital converter (subADC0) that serve as sampling channels (where 0 indicates the stage 0 pipeline of the pipeline analog-to-digital converter) both need to deal with high-frequency and large-swing input signals, which imposes a higher requirement on a core module—a comparator in the subADC0.

Currently, a comparator used in the subADC0 is shown in FIG. 2. In the comparator, a switch S11, a switch S12, a switch S13, a switch S14, a switch S15, and a switch S16 are controlled by a clock signal CLK1; and a switch S21, a switch S22, and a switch S23 are controlled by a clock signal CLK2. When the clock signal CLK1 controls the switches S11-S16 to close, the clock signal CLK2 controls the switches S21-S23 to open; when the clock signal CLK1 controls the switches S11-S16 to open, the clock signal CLK2 controls the switches S21-S23 to close. The comparator has a total of two working phases: a sampling phase and a comparing phase. In the comparing phase, the switches S21-S23 are closed, a capacitor CS1 collects a negative reference signal $V_{refn}$ to one polar plate of the capacitor CS1, and a capacitor CS2 collects a postive reference signal $V_{refp}$ to one polar plate of the capacitor CS2. In this case, an equivalent circuit diagram of the comparator in FIG. 2 is shown in FIG. 3. In the sampling phase, the switches S11-S16 are closed. In this case, the capacitor CS1 and the capacitor CS2 work as coupled capacitors. The capacitor CS1 subtracts a value of a negative reference signal $V_{refn}$, which is collected in a previous comparing phase of the sampling phase, from a value of a positive input signal $V_{ip}$, and transmits a signal obtained after the subtraction to a capacitor Cf1 along an input signal path 1 indicated by a dashed line in FIG. 2. The capacitor CS2 subtracts a value of a positive reference signal $V_{refp}$, which is collected in a previous comparing phase of the sampling phase, from a value of a negative input signal $V_{in}$, and transmits a signal obtained after the subtraction to a capacitor Cf2 along an input signal path 2 indicated by a dashed line in FIG. 2. In this case, an equivalent circuit diagram of the comparator in FIG. 2 is shown in FIG. 4, where a field effect transistor M8 and a field effect transistor M10 form a phase inverter Inv3, and a field effect transistor M9 and a field effect transistor M11 form a phase inverter Inv4. In a next comparing phase of the sampling phase, the switches S21-S23 are closed, the phase inverter formed by the field effect transistor M8 and the field effect transistor M10 is coupled with the phase inverter formed by the field effect transistor M9 and the field effect transistor M11 through the capacitor Cf1 and the capacitor Cf2, thereby forming positive feedback. An equivalent circuit diagram of the comparator in FIG. 2 is shown in FIG. 5, where a capacitor $C_{par8}$ is a gate parasitic capacitor of the field effect transistor M8 and is contained in the field effect transistor M8; a capacitor $C_{par9}$ is a gate parasitic capacitor of the field effect transistor M9 and is contained in the field effect transistor M9; a capacitor $C_{par10}$ is a gate parasitic capacitor of the field effect transistor M10 and is contained in the field effect transistor M10; and a capacitor $C_{par11}$ is a gate parasitic capacitor of the field effect transistor M11 and is contained in the field effect transistor M11. In the comparator shown in FIG. 2, a source of a field effect transistor M6 is connected to a VDD, and a drain of the field effect transistor M6 is connected to a current source; and a source of a field effect transistor M7 is connected to the VDD, and a drain of the field effect transistor M7 is connected to the current source.

As shown in FIG. 5, in the comparing phase, a latch formed by the field effect transistor M8, the field effect transistor M9, the field effect transistor M10, and the field effect transistor M11 drives gates of the field effect transistors through the capacitor Cf1 and the capacitor Cf2. However, a gate of each field effect transistor has a parasitic capacitor. Therefore, when a signal sampled on the capacitor Cf1 drives the field effect transistor M9 and the field effect transistor M11, voltage is divided by the gate parasitic capacitor $C_{par9}$ of the field effect transistor M9 and the gate parasitic capacitor $C_{par11}$ of the field effect transistor M11, thereby weakening a driving capability of the latch and reducing a comparing speed.

To sum up, when the foregoing comparator structure is used, a comparator samples a signal to a sampling capacitor (that is, the capacitor Cf1 and the capacitor Cf2) during signal sampling; in a comparing phase, because a gate of each field effect transistor in a latch of the comparator has a parasitic capacitor, when the signal on the sampling capacitor drives the field effect transistor, the parasitic capacitor produces a voltage dividing effect, thereby weakening a driving capability and reducing a comparing speed.

SUMMARY

Embodiments of the present invention provide a comparator and an analog-to-digital converter, so as to solve a problem that because the comparator samples a signal to a sampling capacitor, in a comparing phase, a parasitic capacitor of a gate of a field effect transistor in a latch of the comparator produces a voltage dividing effect, which weakens a driving capability and reduces a comparing speed.

According to a first aspect, a comparator is provided and includes a sampling module, a pre-amplifying module, a coupling module, a first field effect transistor, a second field effect transistor, a third field effect transistor, a fourth field effect transistor, a first switch, and a second switch, where the first field effect transistor and the second field effect transistor both are P-type field effect transistors; the third field effect transistor and the fourth field effect transistor both are N-type field effect transistors;

the sampling module is configured to collect a positive input signal, a negative input signal, a positive reference signal, and a negative reference signal; obtain a first differential voltage signal according to the positive input signal and the negative reference signal that are collected; and obtain a second differential voltage signal according to the negative input signal and the positive reference signal that are collected;

the pre-amplifying module is configured to amplify the first differential voltage signal to obtain a third differential voltage signal, and amplify the second differential voltage signal to obtain a fourth differential voltage signal;

the coupling module is configured to transmit the third differential voltage signal and the fourth differential voltage signal;

a source of the first field effect transistor and a source of the second field effect transistor both receive a device working voltage signal, and a source of the third field effect transistor and a source of the fourth field effect transistor both are grounded;

a gate of the first field effect transistor receives the third differential voltage signal and is connected to a gate of the third field effect transistor through the first switch, a drain of the first field effect transistor is connected to a gate of the fourth field effect transistor, a gate of the second field effect transistor receives the fourth differential voltage signal and is connected to the gate of the fourth field effect transistor through the second switch, a drain of the second field effect transistor is connected to the gate of the third field effect transistor, a drain of the third field effect transistor is connected to the gate of the fourth field effect transistor, a drain of the fourth field effect transistor is connected to the gate of the third field effect transistor, the gate of the third field effect transistor is connected to a positive output end of the comparator, and the gate of the fourth field effect transistor is connected to a negative output end of the comparator; or, a gate of the first field effect transistor is separately connected to a drain of the second field effect transistor and a positive output end of the comparator, a gate of the second field effect transistor is separately connected to a drain of the first field effect transistor and a negative output end of the comparator, the gate of the first field effect transistor is connected to a gate of the third field effect transistor through the first switch, the gate of the second field effect transistor is connected to a gate of the fourth field effect transistor through the second switch, a drain of the third field effect transistor is connected to the gate of the fourth field effect transistor, a drain of the fourth field effect transistor is connected to the gate of the first field effect transistor, the gate of the third field effect transistor receives the third differential voltage signal, and the gate of the fourth field effect transistor receives the fourth differential voltage signal; and the first switch and the second switch are closed when a first clock signal is a first level signal, and are open when a second clock signal is a first level signal, where when the first clock signal is a first level signal, the second clock signal is a second level signal, and when the second clock signal is a first level signal, the first clock signal is a second level signal.

With reference to the first aspect, in a first possible implementation manner, the coupling module includes a first capacitor and a second capacitor, where the first capacitor is configured to receive and transmit the third differential voltage signal, and the second capacitor is configured to receive and transmit the fourth differential voltage signal.

With reference to the first aspect, in a second possible implementation manner, the pre-amplifying module is specifically configured to:

convert and amplify the first differential voltage signal to obtain a first differential current signal, and convert and amplify the first differential current signal to obtain the third differential voltage signal; and convert and amplify the second differential voltage signal to obtain a second differential current signal, and convert and amplify the second differential current signal to obtain the fourth differential voltage signal.

With reference to the second possible implementation manner of the first aspect, in a third possible implementation manner, the pre-amplifying module includes a fifth field effect transistor, a sixth field effect transistor, a seventh field effect transistor, a first resistor, and a second resistor, where the fifth field effect transistor, the sixth field effect transistor, and the seventh field effect transistor are all N-type field effect transistors; and a gate of the seventh field effect transistor receives a first bias voltage, a source of the seventh field effect transistor is grounded, a drain of the seventh field effect transistor is separately connected to a source of the fifth field effect transistor and a source of the sixth field effect transistor, a gate of the fifth field effect transistor receives the first differential voltage signal, and a gate of the sixth field effect transistor receives the second differential voltage signal; a drain of the fifth field effect transistor is connected to one end of the first resistor, and the other end of the first resistor receives the device working voltage signal; a drain of the sixth field effect transistor is connected to one end of the second resistor, and the other end of the second resistor receives the device working voltage signal; and the drain of the fifth field effect transistor outputs the first differential current signal, the drain of the sixth field effect transistor outputs the second differential current signal, the first resistor is configured to convert the first differential current signal to the third differential voltage signal, and the second resistor is configured to convert the second differential current signal to the fourth differential voltage signal.

With reference to the second possible implementation manner of the first aspect, in a fourth possible implementation manner, the pre-amplifying module includes an eighth field effect transistor, a ninth field effect transistor, a tenth field effect transistor, a third resistor, and a fourth resistor, where the eighth field effect transistor, the ninth field effect transistor, and the tenth field effect transistor are all P-type field effect transistors; and a gate of the tenth field effect transistor receives a second bias voltage, a source of the tenth field effect transistor receives the device working voltage signal, a drain of the tenth field effect transistor is separately connected to a source of the eighth field effect transistor and a source of the ninth field effect transistor, a gate of the eighth field effect transistor receives the first differential voltage signal, and a gate of the ninth field effect transistor receives the second differential voltage signal; a drain of the eighth field effect transistor is connected to one end of the third resistor, and the other end of the third resistor is grounded; a drain of the ninth field effect transistor is connected to one end of the fourth resistor, and the other end of the fourth resistor is grounded; and the drain of the eighth field effect transistor outputs the first differential current signal, the drain of the ninth field effect transistor outputs the second differential current signal, the third resistor is configured to convert the first differential current signal to the third differential voltage signal, and the fourth resistor is configured to convert the second differential current signal to the fourth differential voltage signal.

With reference to the first aspect, in a fifth possible implementation manner, the comparator further includes a third switch and a fourth switch, where:

the third switch is configured to transmit the third differential voltage signal, which is transmitted by the coupling module, to one end that is in the first switch and is not connected to the positive output end of the comparator;

the fourth switch is configured to transmit the fourth differential voltage signal, which is transmitted by the coupling module, to one end that is in the second switch and is not connected to the negative output end of the comparator; and the third switch and the fourth switch start to close at a start moment of a period during which the first clock signal is a first level signal, and are open before an end moment of the period during which the first clock signal is a first level signal.

With reference to the fifth possible implementation manner of the first aspect, in a sixth possible implementation manner, the comparator further includes a fifth switch, a sixth switch, a seventh switch, and an eighth switch, where:

one end of the fifth switch is connected, through the third switch, to the end that is in the first switch and is not connected to the positive output end of the comparator, and the other end of the fifth switch receives a first preset voltage signal; one end of the sixth switch is connected, through the fourth switch, to the end that is in the second switch and is not connected to the negative output end of the comparator, and the other end of the sixth switch receives the first preset voltage signal; and the fifth switch and the sixth switch are closed when the first clock signal is a first level signal, and are open when the second clock signal is a first level signal;

one end of the seventh switch is connected to the end that is in the first switch and is not connected to the positive output end of the comparator, and the other end of the seventh switch receives the first preset voltage signal; and one end of the eighth switch is connected to the end that is in the second switch and is not connected to the negative output end of the comparator, and the other end of the eighth switch receives the first preset voltage signal; and the seventh switch and the eighth switch are closed when a third clock signal is a first level signal, and are open when the third clock signal is a second level signal; and when the first clock signal is a first level signal or the second clock signal is a first level signal, the third clock signal is a second level signal, and after the end moment of the period during which the first clock signal is a first level signal and before a start moment of a period during which the second clock signal is a first level signal, the third clock signal is a first level signal.

With reference to the fifth possible implementation manner of the first aspect, in a seventh possible implementation manner, the comparator further includes a ninth switch, a tenth switch, an eleventh switch, and a twelfth switch, where:

one end of the ninth switch is connected, through the third switch, to the end that is in the first switch and is not connected to the positive output end of the comparator, and the other end of the ninth switch receives a second preset voltage signal; and one end of the tenth switch is connected, through the fourth switch, to the end that is in the second switch and is not connected to the negative output end of the comparator, and the other end of the tenth switch receives a third preset voltage signal;

a difference between the third preset voltage signal and the second preset voltage signal is an offset voltage introduced by the first field effect transistor, the second field effect transistor, the third field effect transistor, and the fourth field effect transistor; and the ninth switch and the tenth switch are closed when the first clock signal is a first level signal, and are open when the second clock signal is a first level signal;

one end of the eleventh switch is connected to the end that is in the first switch and is not connected to the positive output end of the comparator, and the other end of the eleventh switch receives a fourth preset voltage signal; one end of the twelfth switch is connected to the end that is in the second switch and is not connected to the negative output end of the comparator, and the other end of the twelfth switch receives a fourth preset voltage signal; and the fourth preset voltage signal is half of a sum of the third preset voltage signal and the second preset voltage signal; and the eleventh switch and the twelfth switch are closed when a fourth clock signal is a first level signal, and are open when the fourth clock signal is a second level signal, where when the first clock signal is a first level signal or the second clock signal is a first level signal, the fourth clock signal is a second level signal, and after the end moment of the period during which the first clock signal is a first level signal and before a start moment of a period during which the second clock signal is a first level signal, the fourth clock signal is a first level signal.

With reference to the first aspect, in an eighth possible implementation manner, the comparator further includes a thirteenth switch, where one end of the thirteenth switch is connected to one end that is in the first switch and is not connected to the positive output end of the comparator, the other end of the thirteenth switch is connected to one end that is in the second switch and is not connected to the negative output end of the comparator, and the thirteenth switch is closed when the first clock signal is a first level signal.

With reference to the first aspect, in a ninth possible implementation manner, the sampling module is specifically configured to:

when the first clock signal is a first level signal, collect the positive reference signal and the negative reference signal; when the second clock signal is a first level signal, collect the positive input signal and the negative input signal; obtain the first differential voltage signal according to a voltage of the collected positive input signal and a voltage of a last negative reference signal that is collected before the positive input signal is collected; and obtain the second differential voltage signal according to a voltage of the collected negative input signal and a voltage of a last positive reference signal that is collected before the negative input signal is collected.

With reference to the ninth possible implementation manner of the first aspect, in a tenth possible implementation manner, the sampling module includes a fourteenth switch, a fifteenth switch, a sixteenth switch, a seventeenth switch, an eighteenth switch, a third capacitor, and a fourth capacitor, where:

one end of the fourteenth switch receives the positive reference signal, one end of the fifteenth switch receives the negative reference signal, one end of the sixteenth switch receives the positive input signal, one end of the seventeenth switch receives the negative input signal, the other end of the fourteenth switch and the other end of the seventeenth switch both are connected to one end of the fourth capacitor, the other end of the fifteenth switch and the other end of the sixteenth switch both are connected to one end of the third capacitor, and the other end of the third capacitor is connected to the other end of the fourth capacitor through the eighteenth switch; and one end that is of the third capacitor and is connected to the eighteenth switch outputs the first differential voltage signal, and one end that is of the fourth capacitor and is connected to the eighteenth switch outputs the second differential voltage signal; and the fourteenth switch, the fifteenth switch, and the eighteenth switch are closed when the first clock signal is a first level signal, and the sixteenth switch and the seventeenth switch are closed when the second clock signal is a first level signal.

With reference to the first aspect, in an eleventh possible implementation manner, the comparator further includes a first phase inverter and a second phase inverter, where:

one end that is in the first switch and is connected to the positive output end of the comparator is connected to the positive output end of the comparator through the first phase inverter, and one end that is in the second switch and is connected to the negative output end of the comparator is connected to the negative output end of the comparator through the second phase inverter.

According to a second aspect, an analog-to-digital converter is provided and includes any one comparator according to the first aspect and the first possible implementation manner of the first aspect to the eleventh possible implementation manner of the first aspect.

Beneficial effects of the embodiments of the present invention include:

According to the comparator provided in the embodiments of the present invention, a sampling module obtains a first differential voltage signal according to a positive input signal and a positive reference signal that are collected, and obtains a second differential voltage signal according to a negative input signal and a negative reference signal that are collected; a pre-amplifying module converts the first differential voltage signal to obtain a first differential current signal, and converts the first differential current signal to obtain a third differential voltage signal; a coupling module transmits the third differential voltage signal to a gate of a first field effect transistor (or a gate of a third field effect transistor), and stores the third differential voltage signal to a gate parasitic capacitor of the first field effect transistor (or the third field effect transistor); the pre-amplifying module converts the second differential voltage signal to a second differential current signal, and converts the second differential current signal to a fourth differential voltage signal; and the coupling module transmits the fourth differential voltage signal to a gate of a second field effect transistor (or a gate of a fourth field effect transistor), and stores the fourth differential voltage signal to a gate parasitic capacitor of the second field effect transistor (or the fourth field effect transistor). Therefore, when a first switch and a second switch are closed, that is, a first clock signal is a first level signal, the signal on the gate parasitic capacitor of the first field effect transistor (or the third field effect transistor) and the signal on the gate parasitic capacitor of the second field effect transistor (or the fourth field effect transistor) drive a latch formed by the first field effect transistor, the second field effect transistor, the third field effect transistor, and the fourth field effect transistor to perform a positive feedback process, thereby solving a problem that: when input signals are sampled to a sampling capacitor and the signals on the sampling capacitor are used to drive the field effect transistor in the latch, because of a voltage dividing effect of the gate parasitic capacitor of the field effect transistor in the latch, a part of the signals on the sampling capacitor is allocated to the gate parasitic capacitor, so that the signals on the sampling capacitor reduce, a capability for driving the field effect transistor in the latch is reduced, and further, a comparing speed is reduced.

DETAILED DESCRIPTION

An embodiment of the present invention provides a comparator. During signal sampling, a signal is directly sampled to a gate parasitic capacitor of a field effect transistor in a latch of the comparator, so that when the field effect transistor in the latch is driven, the signal on the gate parasitic capacitor directly drives the field effect transistor in the latch. A collected signal does not undergo voltage dividing, thereby solving a problem that: when an input signal is sampled to a sampling capacitor and the signal on the sampling capacitor is used to drive the field effect transistor in the latch, because of a voltage dividing effect of the gate parasitic capacitor of the field effect transistor in the latch, a part of the signal on the sampling capacitor is allocated to the gate parasitic capacitor, so that the signal on the sampling capacitor reduces, a capability for driving the field effect transistor in the latch is reduced, and further, a comparing speed is reduced.

The following describes specific implementation manners of a comparator and an analog-to-digital converter provided in embodiments of the present invention with reference to the accompanying drawings for the specification.

Figure 6A:
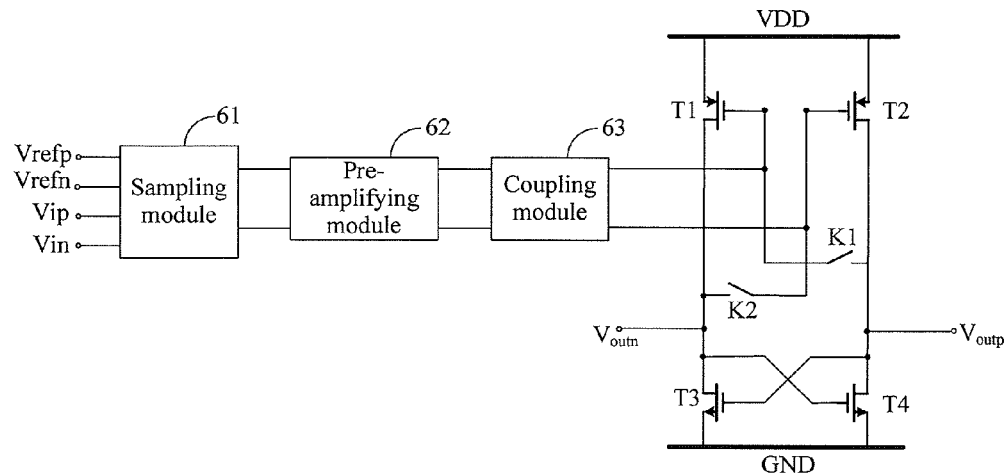
FIG. 6a is a first schematic structural diagram of a comparator according to an embodiment of the present invention.
Figure 6B:
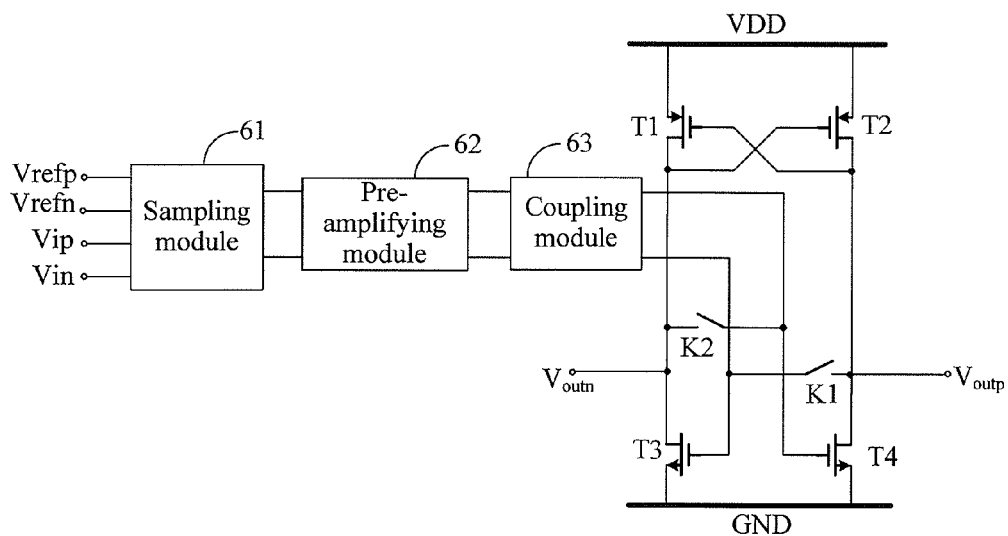
FIG. 6b is a second schematic structural diagram of a comparator according to an embodiment of the present invention.

An embodiment of the present invention provides a comparator, as shown in FIG. 6a or FIG. 6b, specifically including a sampling module 61, a pre-amplifying module 62, a coupling module 63, a first field effect transistor T1, a second field effect transistor T2, a third field effect transistor T3, a fourth field effect transistor T4, a first switch K1, and a second switch K2, where the first field effect transistor T1 and the second field effect transistor T2 both are P-type field effect transistors, and the third field effect transistor T3 and the fourth field effect transistor T4 both are N-type field effect transistors.

The sampling module 61 is configured to collect a positive input signal Vip, a negative input signal Vin, a positive reference signal Vrefp, and a negative reference signal Vrefn, obtain a first differential voltage signal according to the positive input signal Vip and the negative reference signal Vrefn that are collected, and obtain a second differential voltage signal according to the negative input signal Vin and the positive reference signal Vrefp that are collected, where the positive input signal Vip is a signal received at a positive input end of the comparator, the negative input signal Vin is a signal received at a negative input end of the comparator, the positive reference signal Vrefp is a signal received at a positive reference end of the comparator, and the negative reference signal Vrefn is a signal received at a negative reference end of the comparator.

The pre-amplifying module 62 is configured to amplify the first differential voltage signal to obtain a third differential voltage signal, and amplify the second differential voltage signal to obtain a fourth differential voltage signal.

The coupling module 63 is configured to transmit the third differential voltage signal and the fourth differential voltage signal.

The first field effect transistor T1, the second field effect transistor T2, the third field effect transistor T3, the fourth field effect transistor T4, the first switch K1, and the second switch K2 may be connected in a first connection manner. As shown in FIG. 6a, a source of the first field effect transistor T1 and a source of the second field effect transistor T2 both receive a device working voltage signal VDD, a gate of the first field effect transistor T1 receives the third differential voltage signal and is connected to a gate of the third field effect transistor T3 through the first switch K1, a drain of the first field effect transistor T1 is connected to a gate of the fourth field effect transistor T4, a gate of the second field effect transistor T2 receives the fourth differential voltage signal and is connected to the gate of the fourth field effect transistor T4 through the second switch K2, a drain of the second field effect transistor T2 is connected to the gate of the third field effect transistor T3, a source of the third field effect transistor T3 and a source of the fourth field effect transistor T4 both are grounded, that is, are connected to GND, a drain of the third field effect transistor T3 is connected to the gate of the fourth field effect transistor T4, a drain of the fourth field effect transistor T4 is connected to the gate of the third field effect transistor T3, the gate of the third field effect transistor T3 is connected to a positive output end $V_{outp}$ of the comparator, and the gate of the fourth field effect transistor T4 is connected to a negative output end $V_{outn}$ of the comparator. Alternatively, a second connection manner may be used. As shown in FIG. 6b, a source of the first field effect transistor T1 and a source of the second field effect transistor T2 both receive a device working voltage signal VDD, a gate of the first field effect transistor T1 is separately connected to a drain of the second field effect transistor T2 and a positive output end Voutp of the comparator, a gate of the second field effect transistor T2 is separately connected to a drain of the first field effect transistor T1 and a negative output end Voutn of the comparator, the gate of the first field effect transistor T1 is connected to a gate of the third field effect transistor T3 through the first switch K1, the gate of the second field effect transistor T2 is connected to a gate of the fourth field effect transistor T4 through the second switch K2, a drain of the third field effect transistor T3 is connected to the gate of the second field effect transistor T2, a drain of the fourth field effect transistor T4 is connected to the gate of the first field effect transistor T1, the gate of the third field effect transistor T3 receives the third differential voltage signal, the gate of the fourth field effect transistor T4 receives the fourth differential voltage signal, and a source of the third field effect transistor T3 and a source of the fourth field effect transistor T4 both are grounded, that is, are connected to GND.

The first switch K1 and the second switch K2 are closed when a first clock signal CLK1 is a first level signal, and are open when a second clock signal CLK2 is a first level signal, where when the first clock signal CLK1 is a first level signal, the second clock signal CLK2 is a second level signal; when the second clock signal CLK2 is a first level signal, the first clock signal CLK1 is a second level signal.

The first clock signal CLK1 and the second clock signal CLK2 cannot be a first level signal at the same time.

If the comparator shown in FIG. 6a is used, when the second clock signal is a first level signal, the third differential voltage signal output by the pre-amplifying module is collected to the gate of the first field effect transistor, and the fourth differential voltage signal output by the pre-amplifying module is collected to the gate of the second field effect transistor. When the second clock signal is a first level signal, the signal on the gate of the first field effect transistor and the signal on the gate of the second field effect transistor are an initial voltage of a latch (which includes the first field effect transistor, the second field effect transistor, the third field effect transistor, and the fourth field effect transistor). Compared with the comparator shown in FIG. 2 (where an initial voltage of the comparator shown in FIG. 2 undergoes voltage dividing), this comparator has a higher speed because the initial voltage is higher. That is, the speed of the comparator can be improved by using the structure shown in FIG. 6a.

In a case that the comparator shown in FIG. 6b is used, when the second clock signal is a first level signal, the third differential voltage signal output by the pre-amplifying module is collected to the gate of the third field effect transistor, and the fourth differential voltage signal output by the pre-amplifying module is collected to the gate of the fourth field effect transistor. When the second clock signal is a first level signal, the signal on the gate of the third field effect transistor and the signal on the gate of the fourth field effect transistor are an initial voltage of a latch (which includes the first field effect transistor, the second field effect transistor, the third field effect transistor, and the fourth field effect transistor). Compared with the comparator shown in FIG. 2 (where an initial voltage of the comparator shown in FIG. 2 undergoes voltage dividing), this comparator has a higher speed because the initial voltage is higher. That is, the speed of the comparator can be improved by using the structure shown in FIG. 6b.

Therefore, a working process and a working principle when the first field effect transistor T1, the second field effect transistor T2, the third field effect transistor T3, the fourth field effect transistor T4, the first switch K1, and the second switch K2 in the comparator are connected in the manner shown in FIG. 6a are similar to a working process and a working principle when the connection manner shown in FIG. 6b is used. The following makes description merely by using an example that the first field effect transistor T1, the second field effect transistor T2, the third field effect transistor T3, the fourth field effect transistor T4, the first switch K1, and the second switch K2 in the comparator are connected in the manner shown in FIG. 6a.

Figure 7:
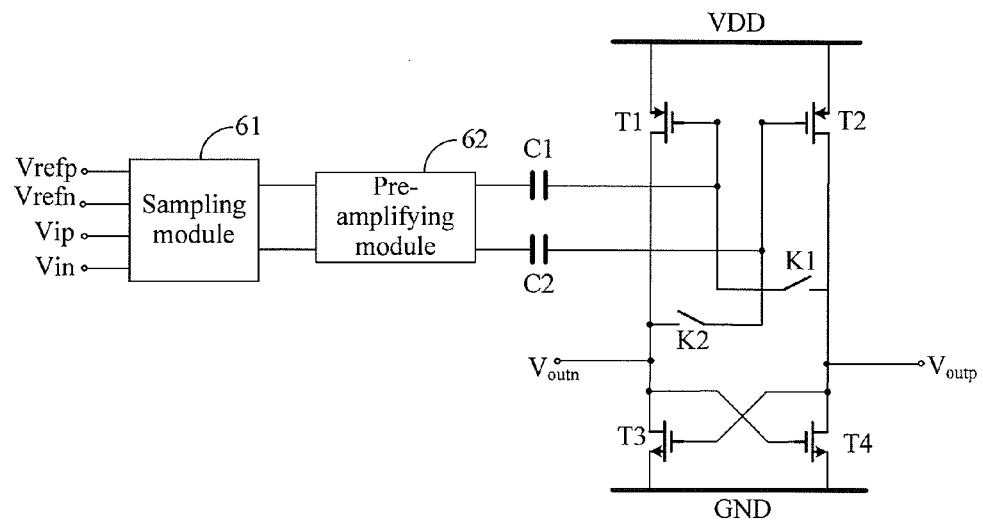
FIG. 7 is a third schematic structural diagram of a comparator according to an embodiment of the present invention.

Optionally, as shown in FIG. 7, the coupling module in the comparator provided in the embodiment of the present invention includes a first capacitor C1 and a second capacitor C2, where the first capacitor C1 is configured to receive and transmit the third differential voltage signal, and the second capacitor C2 is configured to receive and transmit the fourth differential voltage signal.

Optionally, the pre-amplifying module provided in the embodiment of the present invention is specifically configured to: convert and amplify the first differential voltage signal to obtain a first differential current signal, and convert and amplify the first differential current signal to obtain the third differential voltage signal; and convert and amplify the second differential voltage signal to obtain a second differential current signal, and convert and amplify the second differential current signal to obtain the fourth differential voltage signal.

Figure 8A:
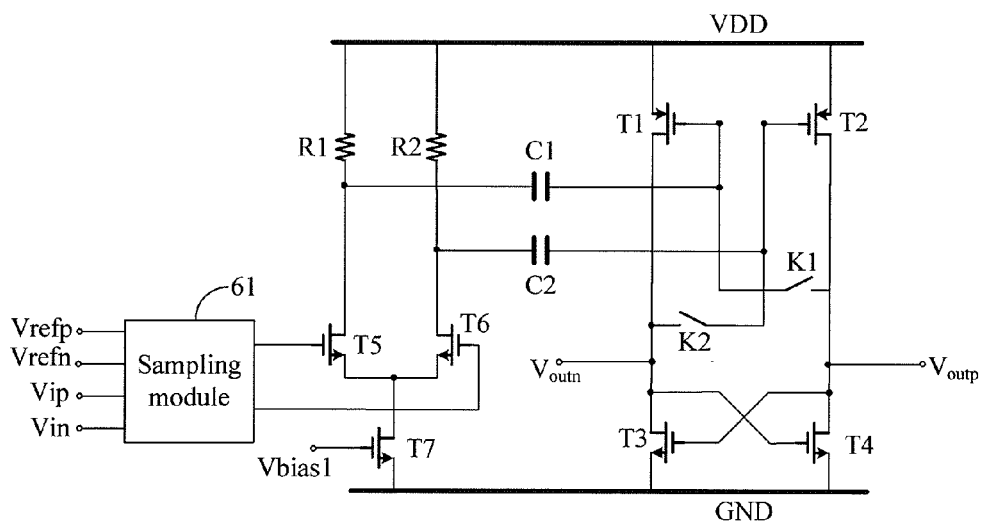
FIG. 8a is a fourth schematic structural diagram of a comparator according to an embodiment of the present invention.

Optionally, as shown in FIG. 8a, the pre-amplifying module in the comparator provided in the embodiment of the present invention includes a fifth field effect transistor T5, a sixth field effect transistor T6, a seventh field effect transistor T7, a first resistor R1, and a second resistor R2, where the fifth field effect transistor T5, the sixth field effect transistor T6, and the seventh field effect transistor T7 are all N-type field effect transistors; and a gate of the seventh field effect transistor T7 receives a first bias voltage Vbias1, a source of the seventh field effect transistor T7 is grounded, that is, is connected to GND, a drain of the seventh field effect transistor T7 is separately connected to a source of the fifth field effect transistor T5 and a source of the sixth field effect transistor T6, a gate of the fifth field effect transistor T5 receives the first differential voltage signal, and a gate of the sixth field effect transistor T6 receives the second differential voltage signal; a drain of the fifth field effect transistor T5 is connected to one end of the first resistor R1, and the other end of the first resistor R1 receives the device working voltage signal VDD; a drain of the sixth field effect transistor T6 is connected to one end of the second resistor R2, and the other end of the second resistor R2 receives the device working voltage signal VDD; and the drain of the fifth field effect transistor T5 outputs the first differential current signal, the drain of the sixth field effect transistor T6 outputs the second differential current signal, the first resistor R1 is configured to convert the first differential current signal to the third differential voltage signal, and the second resistor R2 is configured to convert the second differential current signal to the fourth differential voltage signal.

Figure 1:
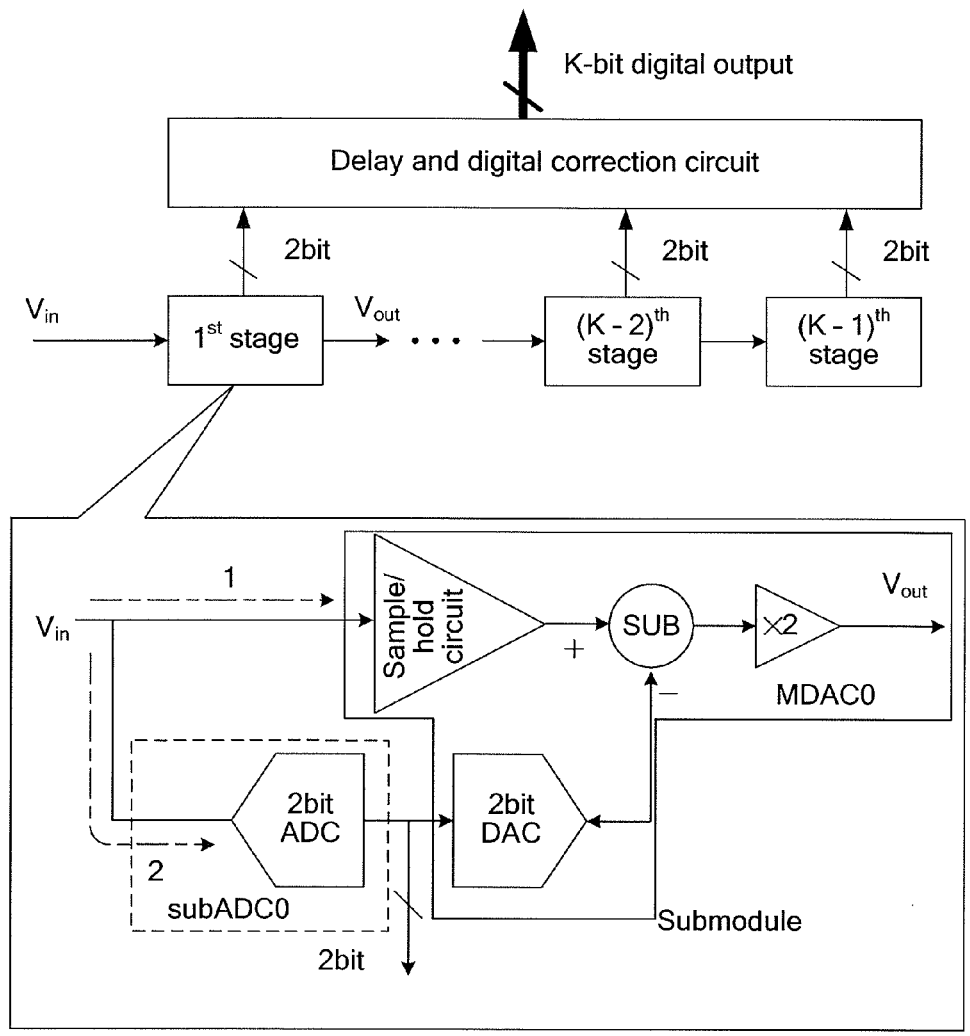
FIG. 1 is a schematic structural diagram of a pipeline ADC without a sample-and-hold stage in the prior art.
Figure 2:
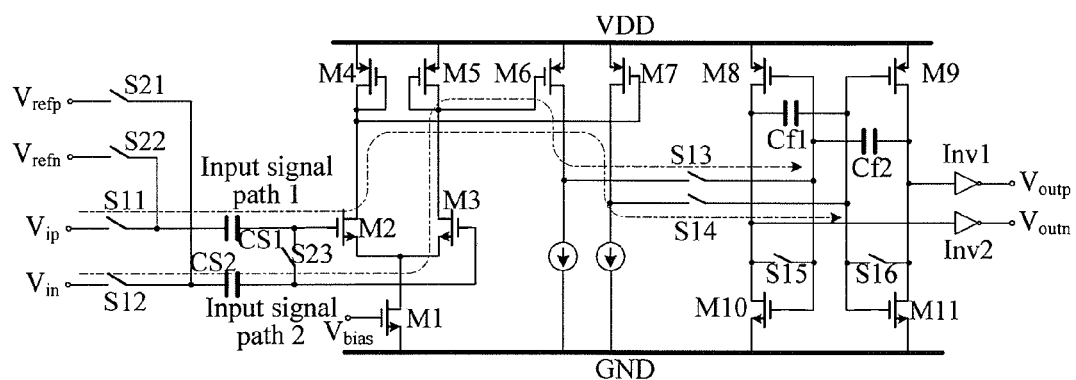
FIG. 2 is a schematic structural diagram of a comparator in a pipeline ADC without a sample-and-hold stage in the prior art.
Figure 3:
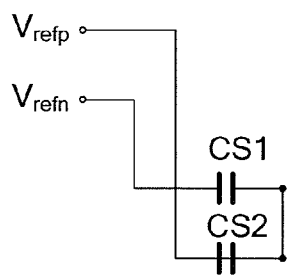
FIG. 3 to FIG. 5 are equivalent circuit diagrams of a comparator in a pipeline ADC without a sample-and-hold stage in different working stages in the prior art.
Figure 4:
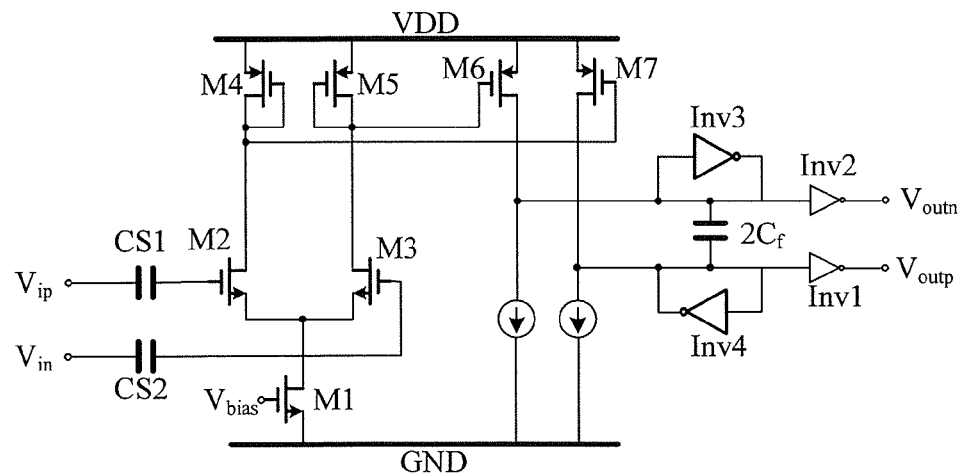
Figure 5:
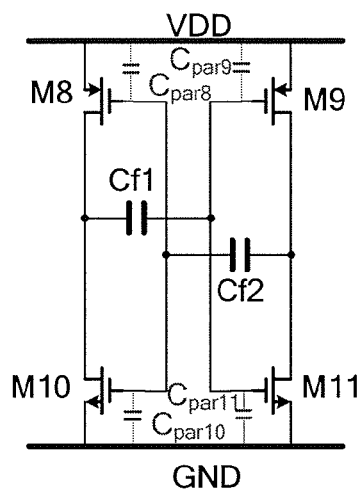

When a comparator of the structure shown in FIG. 2 is used, on a sampling signal path, after passing through an active device, a positive input signal Vip is collected to a capacitor Cf2 through a capacitor CS1, a field effect transistor M2, a field effect transistor M4, and a field effect transistor M7, and a negative input signal Vin is collected to a capacitor Cf1 through a capacitor CS2, a field effect transistor M3, a field effect transistor M5, and a field effect transistor M6. The capacitor Cf1 and the capacitor Cf2 cannot be too small, so that a signal for driving field effect transistors in a latch is large enough. The capacitor CS1 is the same as the capacitor CS2, the field effect transistor M2 is the same as the field effect transistor M3, the field effect transistor M4 is the same as the field effect transistor M5, the field effect transistor M6 is the same as the field effect transistor M7, the capacitor Cf1 is the same as the capacitor Cf2, and the field effect transistor M8 is the same as the field effect transistor M9. Therefore, parameters of an input signal path 1 is the same as parameters of an input signal path 2. The input signal path 1 is used as an example. There are mainly two extremes that affect a time constant of the input signal path: 1. a derivative of admittance of a gate parasitic capacitor of the field effect transistor M2, a gate parasitic capacitor of the field effect transistor M4, a gate parasitic capacitor of the field effect transistor M7, and the field effect transistor M4; 2. a derivative of admittance of a source parasitic capacitor of the field effect transistor M7, a parasitic capacitor of a related node of a phase inverter formed by the field effect transistor M9 and the field effect transistor M11, the capacitor Cf2, and the phase inverter formed by the field effect transistor M9 and the field effect transistor M11. Therefore, it is difficult to design a high bandwidth for the comparator of this structure, thereby causing sampling asynchronization between an MDAC0 and a subADC0 when a high-frequency signal is input.

If the pre-amplifying module and the coupling module use the structure shown in FIG. 8a, when the second clock signal CLK2 is a first level signal, the positive input signal Vip is collected to the gate of the first field effect transistor T1 through the sampling module, the fifth field effect transistor T5, and the first capacitor, where a time constant of this signal path is mainly determined by the first resistor R1 and the gate parasitic capacitor of the first field effect transistor T1; and the negative input signal Vin is collected to the gate of the second field effect transistor T2 through the sampling module, the sixth field effect transistor T6, and the second capacitor, where a time constant of this signal path is mainly determined by the second resistor R2 and the gate parasitic capacitor of the second field effect transistor T2. Because the fifth field effect transistor T5 is the same as the sixth field effect transistor T6, the first resistor R1 is the same as the second resistor R2, the first capacitor C1 is the same as the second capacitor C2, and the first field effect transistor T1 is the same as the second field effect transistor T2, time constants of the two signal paths are equal. The bandwidth of the comparator is determined by the time constants. Because the gate parasitic capacitor of the first field effect transistor T1 is generally small (the gate parasitic capacitor of the second field effect transistor T2 is also small), and the signal sampling path is mainly an RC network, relatively high bandwidth can be designed for the comparator, which helps to achieve sampling synchronization between the MDAC0 and the subADC0 when a high-frequency signal is input.

Figure 8B:
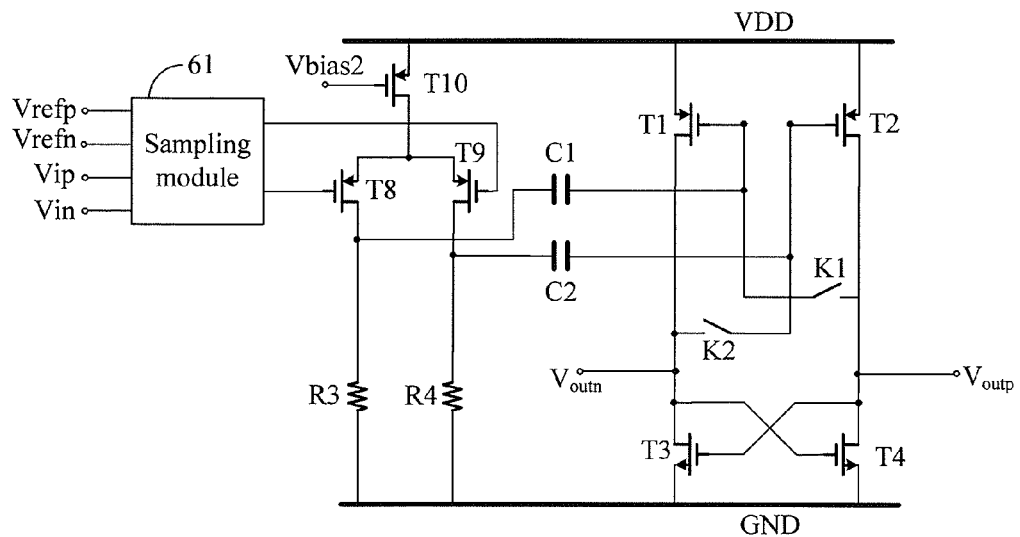
FIG. 8b is a fifth schematic structural diagram of a comparator according to an embodiment of the present invention.

Optionally, as shown in FIG. 8b, the pre-amplifying module in the comparator provided in the embodiment of the present invention includes an eighth field effect transistor T8, a ninth field effect transistor T9, a tenth field effect transistor T10, a third resistor R3, and a fourth resistor R4, where the eighth field effect transistor T8, the ninth field effect transistor T9, and the tenth field effect transistor T10 are all P-type field effect transistors; and a gate of the tenth field effect transistor T10 receives a second bias voltage Vbias2, a source of the tenth field effect transistor T10 receives the device working voltage signal VDD, a drain of the tenth field effect transistor T10 is separately connected to a source of the eighth field effect transistor T8 and a source of the ninth field effect transistor T9, a gate of the eighth field effect transistor T8 receives the first differential voltage signal, and a gate of the ninth field effect transistor T9 receives the second differential voltage signal; a drain of the eighth field effect transistor T8 is connected to one end of the third resistor R3, and the other end of the third resistor R3 is grounded; a drain of the ninth field effect transistor T9 is connected to one end of the fourth resistor R4, and the other end of the fourth resistor R4 is grounded; and the drain of the eighth field effect transistor T8 outputs the first differential current signal, the drain of the ninth field effect transistor T9 outputs the second differential current signal, the third resistor R3 is configured to convert the first differential current signal to the third differential voltage signal, and the fourth resistor R4 is configured to convert the second differential current signal to the fourth differential voltage signal.

If the pre-amplifying module and the coupling module use the structure shown in FIG. 8b, when the second clock signal CLK2 is a first level signal, the positive input signal Vip is collected to the gate of the first field effect transistor T1 through the sampling module, the eighth field effect transistor T8, and the first capacitor, where a time constant of this signal path is mainly determined by the third resistor R3 and the gate parasitic capacitor of the first field effect transistor T1; and the negative input signal Vin is collected to the gate of the second field effect transistor T2 through the sampling module, the ninth field effect transistor T9, and the second capacitor, where a time constant of this signal path is mainly determined by the fourth resistor R4 and the gate parasitic capacitor of the second field effect transistor T2. Because the eighth field effect transistor T8 is the same as the ninth field effect transistor T9, the third resistor R3 is the same as the fourth resistor R4, the first capacitor C1 is the same as the second capacitor C2, and the first field effect transistor T1 is the same as the second field effect transistor T2, time constants of the two signal paths are equal. The bandwidth of the comparator is determined by the time constants. Because the gate parasitic capacitor of the first field effect transistor T1 is generally small (the gate parasitic capacitor of the second field effect transistor T2 is also small), and the signal sampling path is mainly an RC network, relatively high bandwidth can be designed for the comparator, which helps to achieve sampling synchronization between the MDAC0 and the subADC0 when a high-frequency signal is input.

Therefore, a working process and a working principle of the comparator shown in FIG. 8a are the same as a working process and a working principle of the comparator shown in FIG. 8b. The following makes description merely by using the comparator shown in FIG. 8a as an example.

Figure 9:
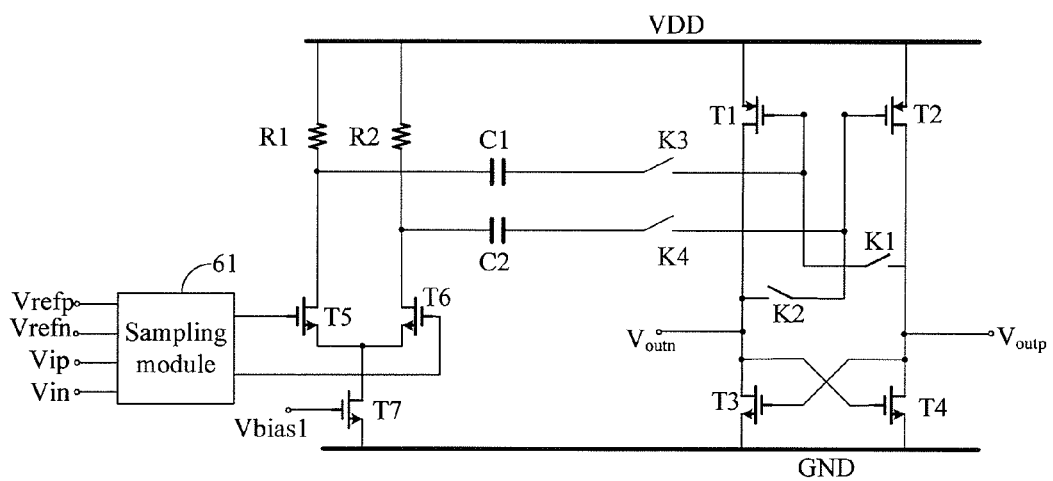
FIG. 9 is a sixth schematic structural diagram of a comparator according to an embodiment of the present invention.

Optionally, as shown in FIG. 9, the comparator provided in the embodiment of the present invention further includes a third switch K3 and a fourth switch K4.

The third switch K3 is configured to transmit the third differential voltage signal, which is transmitted by the coupling module 63, to one end that is in the first switch K1 and is not connected to the positive output end $V_{outp}$ of the comparator. The fourth switch K4 is configured to transmit the fourth differential voltage signal, which is transmitted by the coupling module 63, to one end that is in the second switch K2 and is not connected to the negative output end $V_{outn}$ of the comparator. The third switch K3 and the fourth switch K4 start to close at a start moment of a period during which the first clock signal CLK1 is a first level signal, and are open before an end moment of the period during which the first clock signal CLK1 is a first level signal, and the third switch K3 and the fourth switch K4 are open at a same moment.

A clock signal that controls the third switch K3 and the fourth switch K4 and a clock signal that controls sampling in the MDAC0 are a same signal, and a voltage at the third switch K3 and the fourth switch K4 (that is, a sampling common-mode voltage in the subADC0) is consistent with a sampling common-mode voltage in the MDAC0. Therefore, the third switch K3 and the fourth switch K4 can ensure that the subADC0 and the MDAC0 synchronously sample positive and negative input signals.

Figure 10:
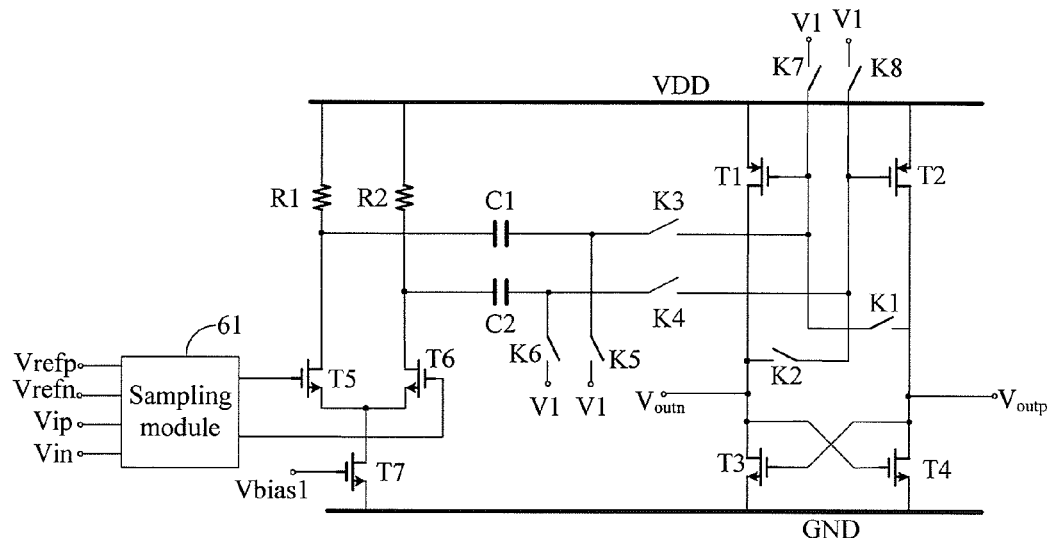
FIG. 10 is a seventh schematic structural diagram of a comparator according to an embodiment of the present invention.

Optionally, as shown in FIG. 10, the comparator provided in the embodiment of the present invention further includes a fifth switch K5, a sixth switch K6, a seventh switch K7, and an eighth switch K8, where:

one end of the fifth switch K5 is connected, through the third switch K3, to the end that is in the first switch K1 and is not connected to the positive output end $V_{outp}$ of the comparator, and the other end of the fifth switch K5 receives a first preset voltage signal V1; one end of the sixth switch K6 is connected, through the fourth switch K4, to the end that is in the second switch K2 and is not connected to the negative output end $V_{outn}$ of the comparator, and the other end of the sixth switch K6 receives the first preset voltage signal V1; and the fifth switch K5 and the sixth switch K6 are closed when the first clock signal CLK1 is a first level signal, and are open when the second clock signal CLK2 is a first level signal;

one end of the seventh switch K7 is connected to the end that is in the first switch K1 and is not connected to the positive output end $V_{outp}$ of the comparator, and the other end of the seventh switch K7 receives a first preset voltage signal V1; and one end of the eighth switch K8 is connected to the end that is in the second switch K2 and is not connected to the negative output end $V_{outn}$ of the comparator, and the other end of the eighth switch K8 receives the first preset voltage signal V1; and the seventh switch K7 and the eighth switch K8 are closed when a third clock signal CLK3 is a first level signal, and are open when the third clock signal CLK3 is a second level signal, where when the first clock signal CLK1 is a first level signal or the second clock signal CLK2 is a first level signal, the third clock signal CLK3 is a second level signal; and after the end moment of the period during which the first clock signal CLK1 is a first level signal and before a start moment of a period during which the second clock signal CLK2 is a first level signal, the third clock signal CLK3 is a first level signal.

Figure 11:
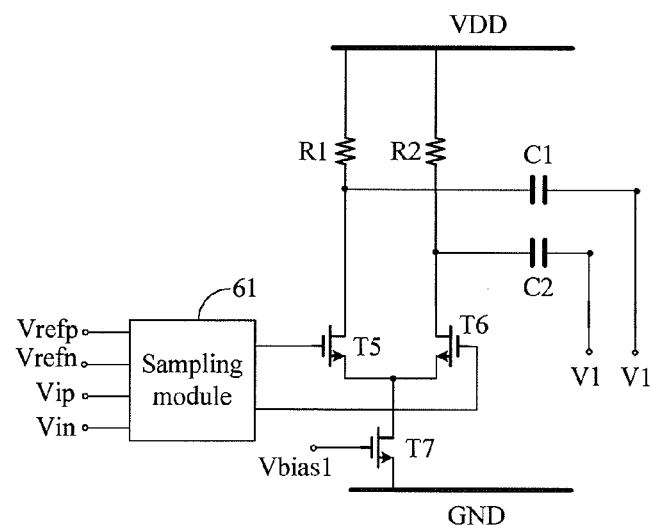
FIG. 11 and FIG. 12 are equivalent circuit diagrams of a comparator in different working stages according to an embodiment of the present invention.
Figure 12:
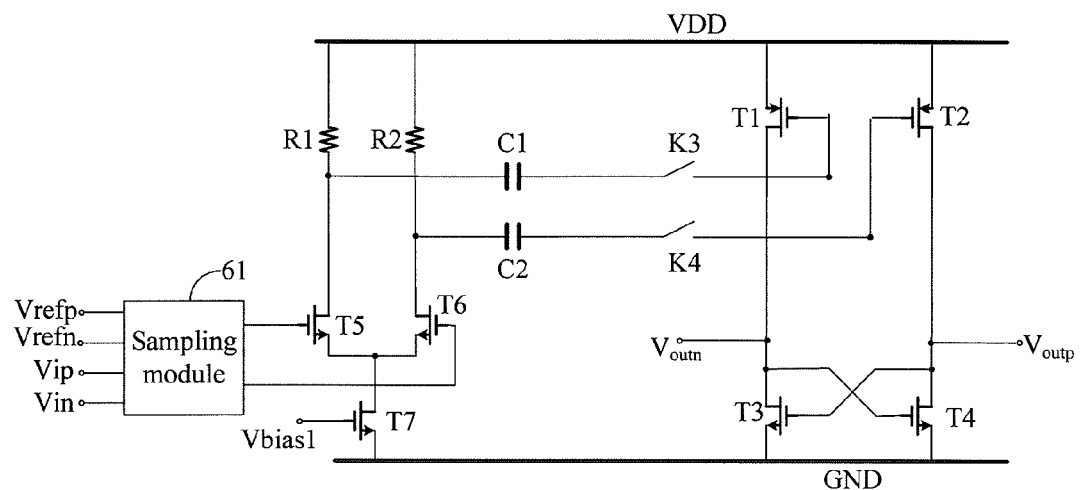

If the comparator uses the structure shown in FIG. 10, when the first clock signal CLK1 is a first level signal, the sampling module collects a positive reference voltage Vrefp and a negative reference voltage Vrefn, the fifth switch K5 and the sixth switch K6 are closed, one end of the first capacitor C1 and one end of the second capacitor C2 both receive a first preset voltage V1, and a difference between signals received by the other end of the first capacitor C1 and the other end of the second capacitor C2 is a pre-amplification offset voltage Voffset (which is determined by a difference between the fifth field effect transistor and the sixth field effect transistor and a difference between the first resistor and the second resistor). In this case, the circuit shown in FIG. 10 is equivalent to the circuit shown in FIG. 11. When the second clock signal CLK2 is a first level signal, the comparator samples positive and negative input signals. In this case, the circuit shown in FIG. 10 is equivalent to the circuit shown in FIG. 12. A pre-amplification offset voltage obtained when the first clock signal CLK1 is a first level signal is consistent with a pre-amplification offset voltage obtained when the second clock signal CLK2 is a first level signal, and capacitors, the first capacitor C1 and the second capacitor C2, record the offset voltage obtained when the first clock signal CLK1 is a first level signal, and cancel out the offset voltage when the second clock signal CLK2 is a first level signal, thereby eliminating an offset voltage introduced by the pre-amplifying module and reducing an equivalent input offset voltage of the comparator.

Figure 13:
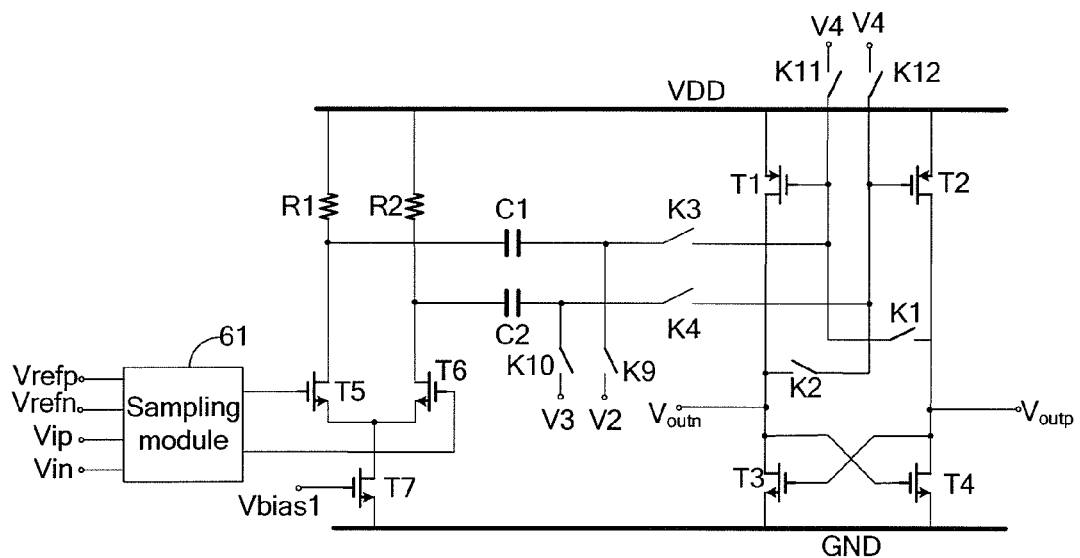
FIG. 13 is an eighth schematic structural diagram of a comparator according to an embodiment of the present invention.

Optionally, as shown in FIG. 13, the comparator provided in the embodiment of the present invention further includes a ninth switch K9, a tenth switch K10, an eleventh switch K11, and a twelfth switch K12, where:

one end of the ninth switch K9 is connected, through the third switch K3, to the end that is in the first switch K1 and is not connected to the positive output end $V_{outp}$ of the comparator, and the other end of the ninth switch K9 receives a second preset voltage signal V2; and one end of the tenth switch K10 is connected, through the fourth switch K4, to one end that is in the second switch K2 and is not connected to the negative output end $V_{outn}$ of the comparator, and the other end of the tenth switch K10 receives a third preset voltage signal V3;

a difference between the third preset voltage signal V3 and the second preset voltage signal V2 is an offset voltage introduced by the first field effect transistor T1, the second field effect transistor T2, the third field effect transistor T3, and the fourth field effect transistor T4; and the ninth switch K9 and the tenth switch K10 are closed when the first clock signal CLK1 is a first level signal, and are open when the second clock signal CLK2 is a first level signal;

one end of the eleventh switch K11 is connected to the end that is in the first switch K1 and is not connected to the positive output end $V_{outp}$ of the comparator, and the other end of the eleventh switch K11 receives a fourth preset voltage signal V4; one end of the twelfth switch K12 is connected to the end that is in the second switch K2 and is not connected to the negative output end Voutn of the comparator, and the other end of the twelfth switch K12 receives the fourth preset voltage signal V4; and the fourth preset voltage signal V4 is half of a sum of the third preset voltage signal V3 and the second preset voltage signal V2; and the eleventh switch K11 and the twelfth switch K12 are closed when a fourth clock signal CLK4 is a first level signal, and are open when the fourth clock signal CLK4 is a second level signal, where when the first clock signal CLK1 is a first level signal or the second clock signal CLK2 is a first level signal, the fourth clock signal CLK4 is a second level signal; and after the end moment of the period during which the first clock signal CLK1 is a first level signal and before a start moment of a period during which the second clock signal CLK2 is a first level signal, the fourth clock signal CLK4 is a first level signal.

The fourth clock signal CLK4 may be the same as the third clock signal CLK3, the fifth switch K5 may be the same as the ninth switch K9, the sixth switch K6 may be the same as the tenth switch K10, the seventh switch K7 may be the same as the eleventh switch K11, and the eighth switch K8 may be the same as the twelfth switch K12.

When the first clock signal CLK1 is a first level signal, the sampling module collects a positive reference voltage Vrefp and a negative reference voltage Vrefn, the ninth switch K9 and the tenth switch K10 are closed, one end of the first capacitor C1 receives a second preset voltage V2, one end of the second capacitor C2 receives a third preset voltage V3, and a difference between signals received by the other end of the first capacitor C1 and the other end of the second capacitor C2 is a pre-amplification offset voltage Voffset (which is determined by a difference between the fifth field effect transistor and the sixth field effect transistor and a difference between the first resistor and the second resistor). When the second clock signal CLK2 is a first level signal, the comparator samples positive and negative input signals. A pre-amplification offset voltage obtained when the first clock signal CLK1 is a first level signal is consistent with a pre-amplification offset voltage obtained when the second clock signal CLK2 is a first level signal. Capacitors, the first capacitor C1 and the second capacitor C2, record the offset voltage when the first clock signal CLK1 is a first level signal, and cancel out the offset voltage when the second clock signal CLK2 is a first level signal. In addition, an offset voltage caused by a difference between the first field effect transistor T1 and the second field effect transistor T2 and a difference between the third field effect transistor T3 and the fourth field effect transistor T4 counteracts a difference between the second preset voltage V2 collected at one end of the first capacitor C1 when the first clock signal CLK1 is a first level signal and the third preset voltage V3 collected by the second capacitor C2, thereby eliminating an offset voltage of the pre-amplifying module and a latch part (which includes the first field effect transistor, the second field effect transistor, the third field effect transistor, and the fourth field effect transistor), and further reducing an equivalent input offset voltage of the comparator. In an actual application, a digital control unit may be used to adaptively regulate the second preset voltage V2 and the third preset voltage V3.

When the comparator shown in FIG. 9 or FIG. 13 is used, because an offset voltage of the comparator may be automatically corrected, sizes of the fifth field effect transistor T5 and the sixth field effect transistor T6 may be made as small as possible (as the sizes of the fifth field effect transistor T5 and the sixth field effect transistor T6 become smaller, a difference between the fifth field effect transistor T5 and the sixth field effect transistor T6 may be larger, and an offset voltage of the pre-amplifying module is larger). As the sizes of the fifth field effect transistor T5 and the sixth field effect transistor T6 become smaller, a gate parasitic capacitor of the fifth field effect transistor T5 and a gate parasitic capacitor of the sixth field effect transistor T6 are smaller, and nonlinear capacitance load seen by a signal source of an input signal is smaller.

Figure 14A:
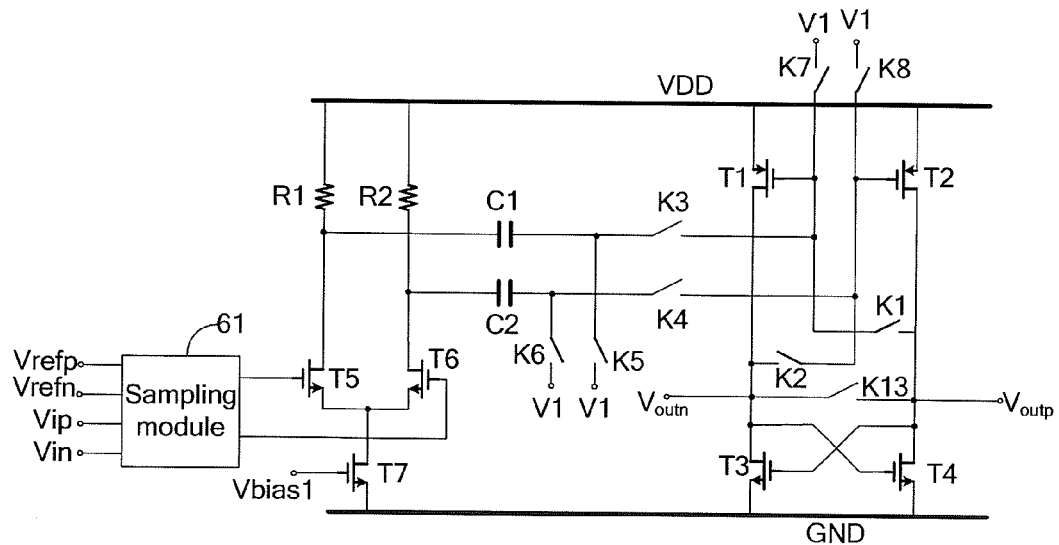
FIG. 14a is a ninth schematic structural diagram of a comparator according to an embodiment of the present invention.
Figure 14B:
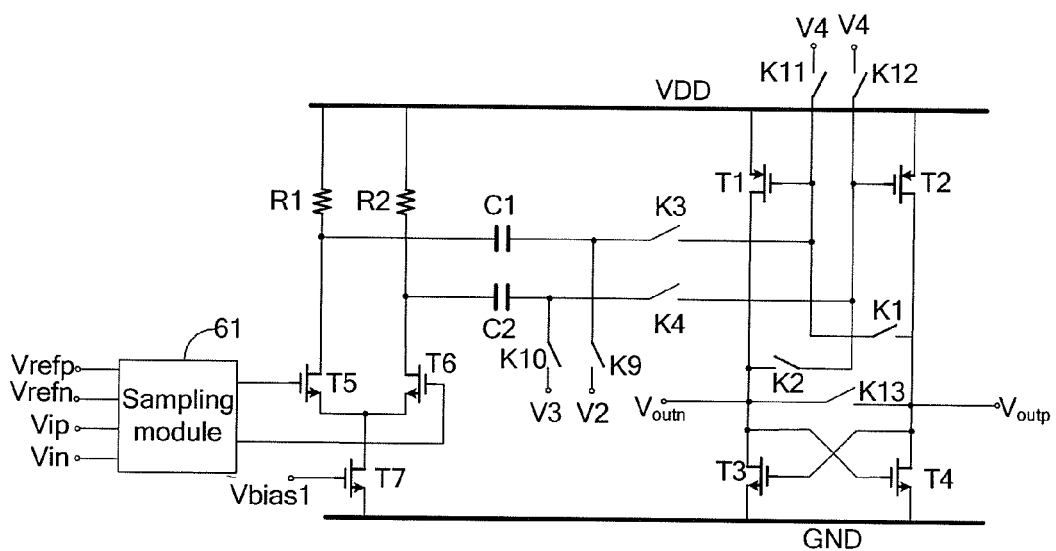
FIG. 14b is a tenth schematic structural diagram of a comparator according to an embodiment of the present invention.

Optionally, as shown in FIG. 14a and FIG. 14b, the comparator provided in the embodiment of the present invention further includes a thirteenth switch K13, where one end of the thirteenth switch K13 is connected to one end that is in the first switch K1 and is not connected to the positive output end $V_{outp}$ of the comparator, the other end of the thirteenth switch K13 is connected to one end that is in the second switch K2 and is not connected to the negative output end $V_{outn}$ of the comparator, and the thirteenth switch K13 is closed when the first clock signal CLK1 is a first level signal.

When the thirteenth switch K13 is closed, two output ends $V_{outp}$ and $V_{outn}$ of the comparator may be reset, so as to eliminate a memory effect of a latch formed by the first field effect transistor T1, the second field effect transistor T2, the third field effect transistor T3, and the fourth field effect transistor T4, and eliminate an impact of a previous comparison result on a next comparison result. The comparator shown in FIG. 14a can eliminate the offset voltage introduced by the pre-amplifying module; and the comparator shown in FIG. 14b can eliminate the offset voltage introduced by the pre-amplifying module and the offset voltage introduced by the latch part (which includes the first field effect transistor, the second field effect transistor, the third field effect transistor, and the fourth field effect transistor).

Optionally, the sampling module in the comparator provided in the embodiment of the present invention is specifically configured to: when the first clock signal CLK1 is a first level signal, collect the positive reference signal Vrefp and the negative reference signal Vrefn; and when the second clock signal CLK2 is a first level signal, collect the positive input signal Vip and the negative input signal Vin; obtain the first differential voltage signal according to a voltage of the collected positive input signal Vip and a voltage of a last negative reference signal Vrefn that is collected before the positive input signal Vip is collected; and obtain the second differential voltage signal according to a voltage of the collected negative input signal Vin and a voltage of a last positive reference signal Vrefp that is collected before the negative input signal Vin is collected.

Figure 15A:
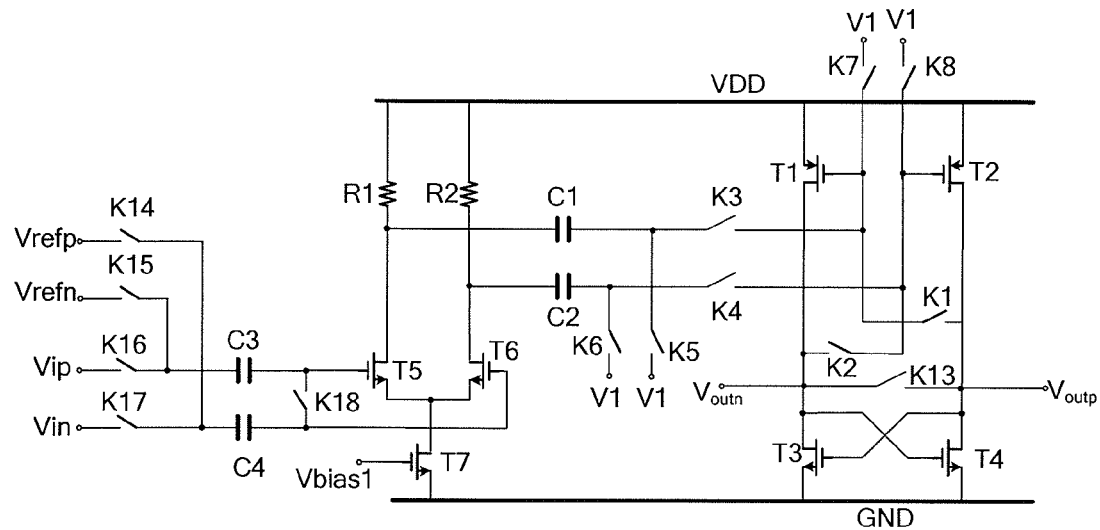
FIG. 15a is an eleventh schematic structural diagram of a comparator according to an embodiment of the present invention.
Figure 15B:
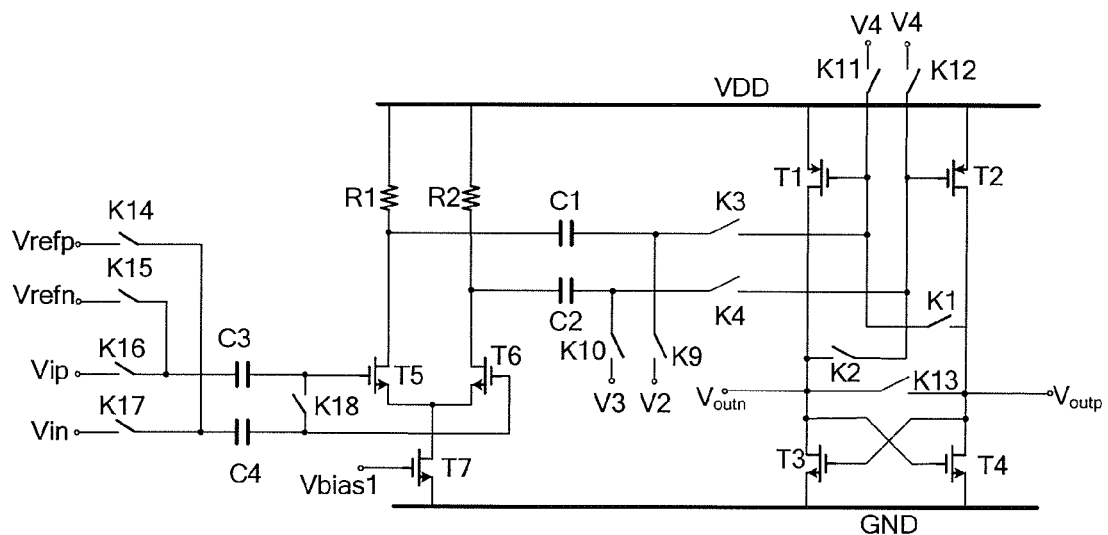
FIG. 15b is a twelfth schematic structural diagram of a comparator according to an embodiment of the present invention.

Optionally, according to the comparator provided in the embodiment of the present invention, as shown in FIG. 15a and FIG. 15b, the sampling module includes a fourteenth switch K14, a fifteenth switch K15, a sixteenth switch K16, a seventeenth switch K17, an eighteenth switch K18, a third capacitor C3, and a fourth capacitor C4, where:

one end of the fourteenth switch K14 receives the positive reference signal Vrefp, one end of the fifteenth switch K15 receives the negative reference signal Vrefn, one end of the sixteenth switch K16 receives the positive input signal Vip, one end of the seventeenth switch K17 receives the negative input signal Vin, the other end of the fourteenth switch K14 and the other end of the seventeenth switch K17 both are connected to one end of the fourth capacitor C4, the other end of the fifteenth switch K15 and the other end of the sixteenth switch K16 both are connected to one end of the third capacitor C3, and the other end of the third capacitor C3 is connected to the other end of the fourth capacitor C4 through the eighteenth switch K18; and one end that is of the third capacitor C3 and is connected to the eighteenth switch K18 outputs the first differential voltage signal, and one end that is of the fourth capacitor C4 and is connected to the eighteenth switch K18 outputs the second differential voltage signal; and the fourteenth switch K14, the fifteenth switch K15, and the eighteenth switch K18 are closed when the first clock signal CLK1 is a first level signal, and the sixteenth switch K16 and the seventeenth switch K17 are closed when the second clock signal CLK2 is a first level signal.

The comparator shown in FIG. 15a can eliminate the offset voltage introduced by the pre-amplifying module; and the comparator shown in FIG. 15b can eliminate the offset voltage introduced by the pre-amplifying module and the offset voltage introduced by the latch part (which includes the first field effect transistor, the second field effect transistor, the third field effect transistor, and the fourth field effect transistor).

Figure 16A:
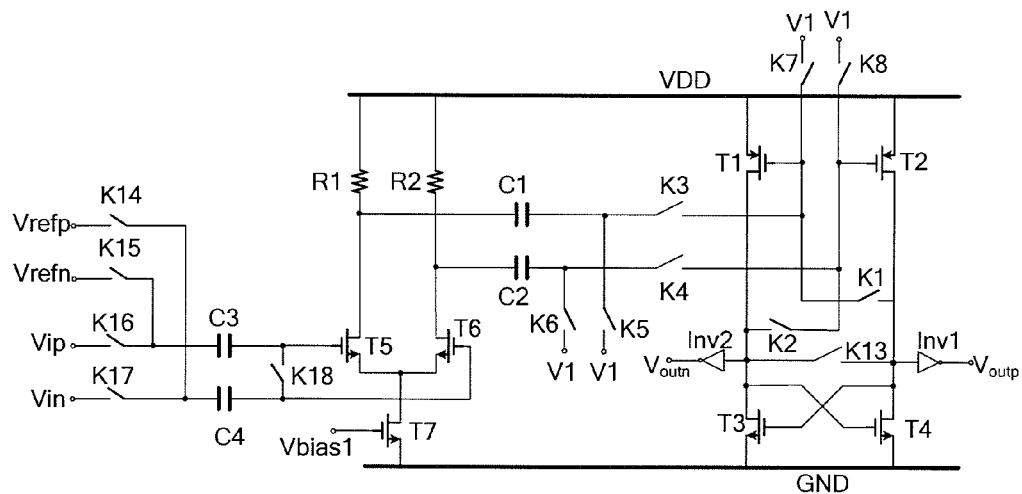
FIG. 16a is a thirteenth schematic structural diagram of a comparator according to an embodiment of the present invention.
Figure 16B:
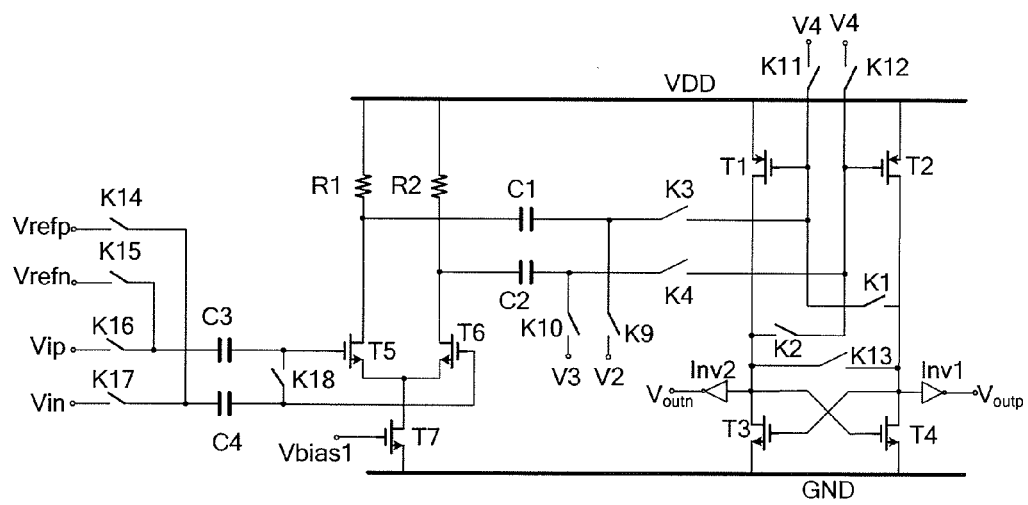
FIG. 16b is a fourteenth schematic structural diagram of a comparator according to an embodiment of the present invention.

Optionally, according to the comparator provided in the embodiment of the present invention, as shown in FIG. 16a and FIG. 16b, the comparator further includes a first phase inverter Inv1 and a second phase inverter Inv2, where one end that is in the first switch K1 and is connected to the positive output end Voutp of the comparator is connected to the positive output end Voutp of the comparator through the first phase inverter Inv1, and one end that is in the second switch K2 and is connected to the negative output end Voutn of the comparator is connected to the negative output end Voutn of the comparator through the second phase inverter Inv2.

The comparator shown in FIG. 16a can eliminate the offset voltage introduced by the pre-amplifying module; and the comparator shown in FIG. 16b can eliminate the offset voltage introduced by the pre-amplifying module and the offset voltage introduced by the latch part (which includes the first field effect transistor, the second field effect transistor, the third field effect transistor, and the fourth field effect transistor).

Figure 17:
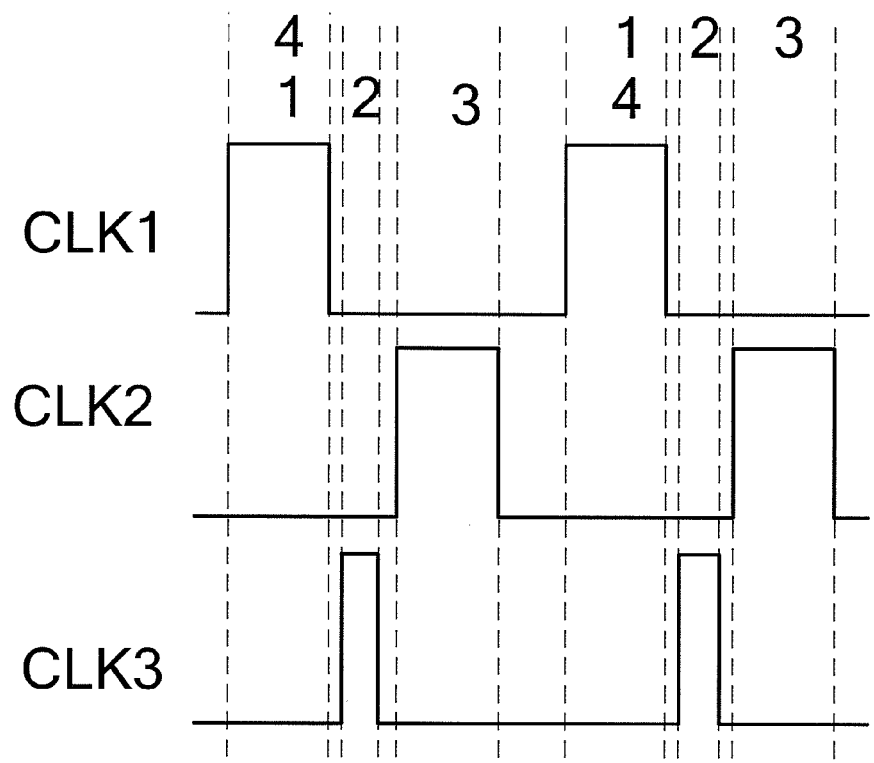
FIG. 17 is a working time sequence diagram of a comparator according to an embodiment of the present invention.

To further describe the comparator provided in the embodiment of the present invention, the following describes a working process of the comparator provided in the embodiment of the present invention through that the switches mentioned in the embodiment of the present invention are closed at a high-level signal as an example and with reference to the timing diagram shown in FIG. 17. Working processes of the comparator shown in FIG. 16a and the comparator shown in FIG. 16b are the same. Therefore, the following makes description merely through the comparator shown in FIG. 16a as an example.

Figure 18A:
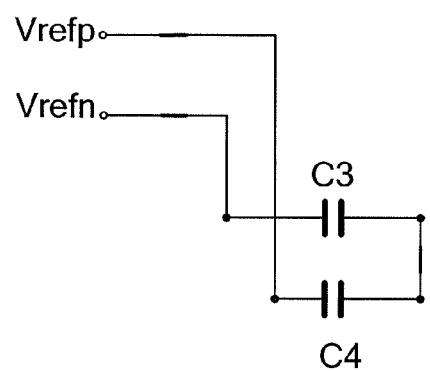
FIG. 18a to FIG. 20 are equivalent circuit diagrams of a comparator in different working stages according to an embodiment of the present invention.
Figure 18B:
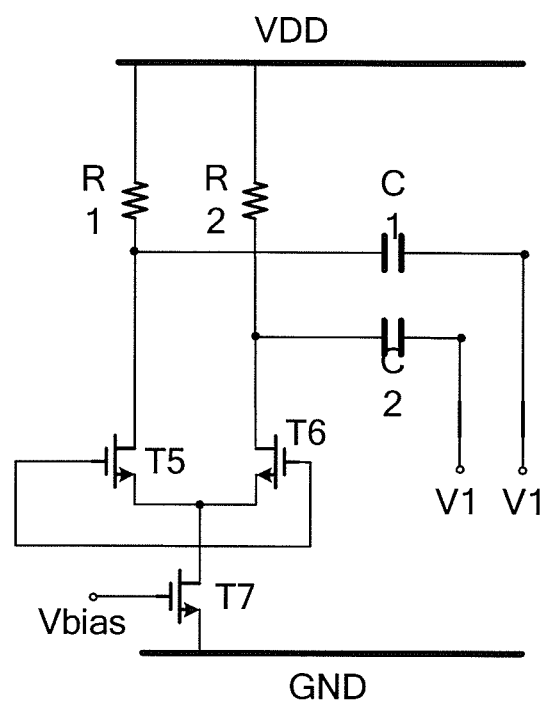
Figure 18C:
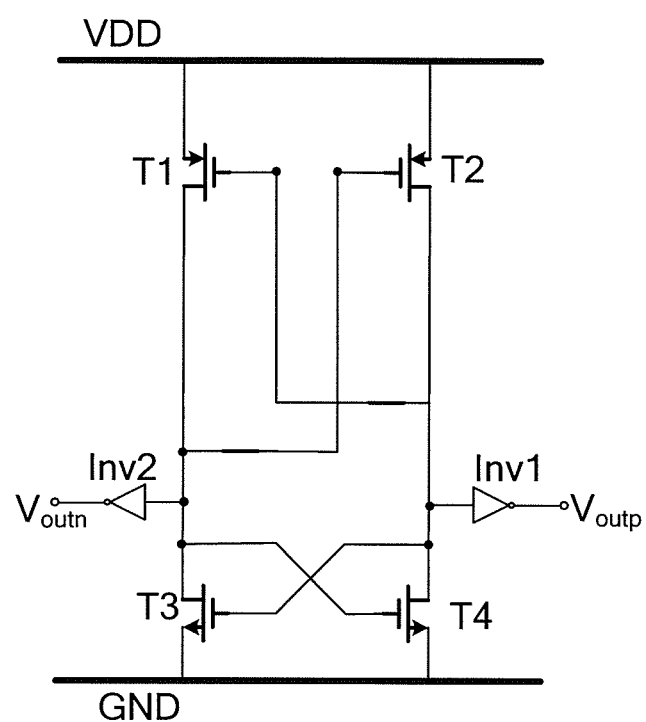

A first step: The first clock signal CLK1 is a high-level signal, and the second clock signal CLK2 and the third clock signal CLK3 both are low-level signals. Therefore, the first switch K1, the second switch K2, the fifth switch K5, the sixth switch K6, the fourteenth switch K14, the fifteenth switch K15, and the eighteenth switch K18 are all closed. The comparator shown in FIG. 16a may be equivalent to three parts, which are shown in FIG. 18a, FIG. 18b, and FIG. 18c. The circuit shown in FIG. 18a collects positive and negative reference voltages, the third capacitor C3 collects a negative reference voltage Vrefn, and the fourth capacitor C4 collects a positive reference voltage Vrefp. The circuit shown in FIG. 18b collects a first preset voltage signal V1 and collects an offset voltage introduced by the pre-amplifying module. The first preset voltage signal may be a sampling common-mode level of the MDAC0, that is, an input common-mode level of an operational amplifier in the MDAC0. The circuit shown in FIG. 18c performs charge re-allocation on a third differential voltage signal and a fourth differential voltage signal that are collected at a previous time, and then starts a positive feedback process. Therefore, the circuit shown in FIG. 18c executes work of a fourth step in a previous comparison process.

Figure 19:
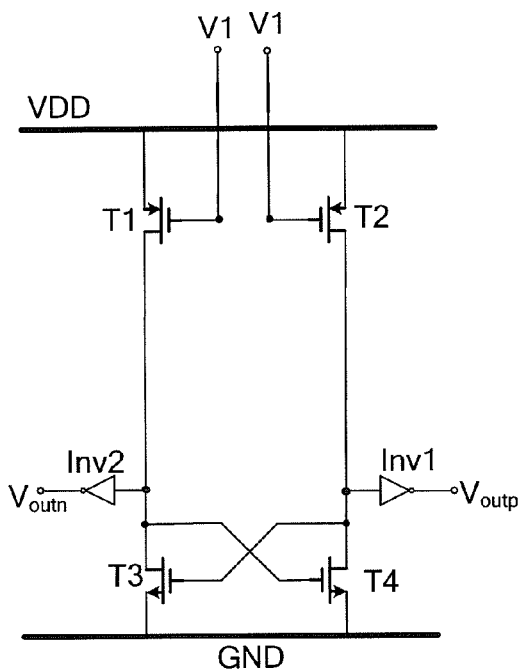

A second step: The third clock signal CLK3 is a high-level signal, and the first clock signal CLK1 and the second clock signal CLK2 both are low-level signals. Therefore, the eleventh switch K11 and the twelfth switch K12 both are closed. The comparator shown in FIG. 16a may be equivalent to the circuit shown in FIG. 19. On the circuit shown in FIG. 19, a gate voltage of the first field effect transistor T1 is pre-charged to a first preset voltage V1, that is, charge left over on the gate parasitic capacitor of the first field effect transistor T1 in a previous comparison process is discharged, and the gate parasitic capacitor is charged; and a gate voltage of the second field effect transistor T2 is pre-charged to the first preset voltage V1, that is, charge left over on the gate parasitic capacitor of the second field effect transistor T2 in the previous comparison process is discharged, and the gate parasitic capacitor is charged.

Figure 20:
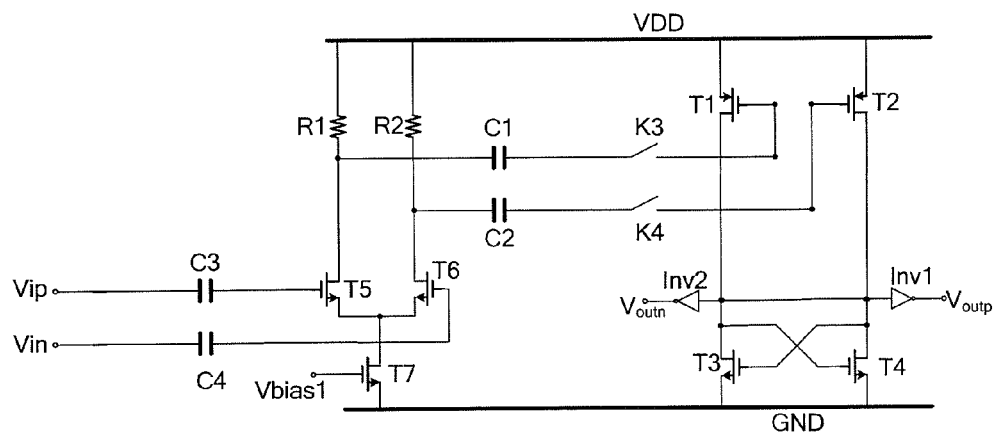

A third step: The second clock signal CLK2 is a high-level signal, and the first clock signal CLK1 and the third clock signal CLK3 both are low-level signals. Therefore, the thirteenth switch K13, the sixteenth switch K16, and the seventeenth switch K17 are all closed, the third switch K3 and the fourth switch K4 start to close at a start moment of a period during which the second clock signal CLK2 is a high-level signal, and are open before an end moment of the period during which the second clock signal CLK2 is a high-level signal, and the third switch K3 and the fourth switch K4 are open at a same moment. The comparator shown in FIG. 16a may be equivalent to the circuit shown in FIG. 20. On the circuit shown in FIG. 20, a positive input signal is collected to the gate parasitic capacitor of the first field effect transistor T1 through the pre-amplifying module and the coupling module, a negative input signal is collected to the gate parasitic capacitor of the second field effect transistor T2 through the pre-amplifying module and the coupling module, and two output ends Voutp and Voutn of the comparator are reset.

A fourth step: This step is also a first step of a next comparison process. The first clock signal CLK1 is a high-level signal, and the second clock signal CLK2 and the third clock signal CLK3 both are low-level signals. Therefore, the first switch K1, the second switch K2, the fifth switch K5, the sixth switch K6, the fourteenth switch K14, the fifteenth switch K15, and the eighteenth switch K18 are all closed. The comparator shown in FIG. 16a may be equivalent to three parts, which are shown in FIG. 18a, FIG. 18b, and FIG. 18c. The circuit shown in FIG. 18c performs charge re-allocation on a first differential voltage signal and a second differential voltage signal that are collected at a current time, and then starts a positive feedback process. The circuit shown in FIG. 18a and the circuit shown in FIG. 18b start to execute a next comparison process.

Then, comparison processes are continuously executed. In two adjacent comparison processes, a fourth step of a previous comparison process and a first step of a next comparison process are executed simultaneously.

An embodiment of the present invention further provides an analog-to-digital converter, including any one comparator according to the embodiments of the present invention.

Based on the foregoing descriptions of the embodiments, a person skilled in the art may clearly understand that the present invention may be implemented by software in addition to a necessary universal hardware platform or by hardware only. Based on such an understanding, the technical solutions of the present invention may be implemented in a form of a software product. The software product may be stored in a nonvolatile storage medium (which may be a CD-ROM, a USB flash drive, or a removable hard disk), and includes several instructions for instructing a computer device (which may be a personal computer, a server, or a network device) to perform the methods described in the embodiments of the present invention.

A person skilled in the art may understand that, the accompanying drawings are merely schematic drawings of exemplary embodiments, and modules or procedures in the accompanying drawings are not necessarily required for implementing the present invention.

A person skilled in the art may understand that the modules in the apparatuses provided in the embodiments may be arranged in the apparatuses in a distributed manner according to the description of the embodiments, or may be arranged in one or more apparatuses which are different from those described in the embodiments. The modules of the foregoing embodiments may be combined into one module, or may be further split into multiple submodules.

The sequence numbers of the foregoing embodiments of the present invention are merely for illustrative purposes, and are not intended to indicate priorities of the embodiments.

Apparently, a person skilled in the art can make various modifications and variations to the present invention without departing from the spirit and scope of the present invention. The present invention shall be construed to include these modifications and variations, provided that these modifications and variations fall within the scope of the claims and equivalent technology of the present invention.

What is claimed is:

1. A comparator, comprising a sampling module, a pre-amplifying module, a coupling module, a first field effect transistor, a second field effect transistor, a third field effect transistor, a fourth field effect transistor, a first switch, and a second switch, wherein the first field effect transistor and the second field effect transistor both are P-type field effect transistors; the third field effect transistor and the fourth field effect transistor both are N-type field effect transistors;

the sampling module is configured to collect a positive input signal, a negative input signal, a positive reference signal, and a negative reference signal; obtain a first differential voltage signal according to the positive input signal and the negative reference signal that are collected; and obtain a second differential voltage signal according to the negative input signal and the positive reference signal that are collected;

the pre-amplifying module is configured to amplify the first differential voltage signal to obtain a third differential voltage signal, and amplify the second differential voltage signal to obtain a fourth differential voltage signal;

the coupling module is configured to transmit the third differential voltage signal and the fourth differential voltage signal;

a source of the first field effect transistor and a source of the second field effect transistor both receive a device working voltage signal, and a source of the third field effect transistor and a source of the fourth field effect transistor both are grounded;

a gate of the first field effect transistor receives the third differential voltage signal and is connected to a gate of the third field effect transistor through the first switch, a drain of the first field effect transistor is connected to a gate of the fourth field effect transistor, a gate of the second field effect transistor receives the fourth differential voltage signal and is connected to the gate of the fourth field effect transistor through the second switch, a drain of the second field effect transistor is connected to the gate of the third field effect transistor, a drain of the third field effect transistor is connected to the gate of the fourth field effect transistor, a drain of the fourth field effect transistor is connected to the gate of the third field effect transistor, the gate of the third field effect transistor is connected to a positive output end of the comparator, and the gate of the fourth field effect transistor is connected to a negative output end of the comparator; or, a gate of the first field effect transistor is separately connected to a drain of the second field effect transistor and a positive output end of the comparator, a gate of the second field effect transistor is separately connected to a drain of the first field effect transistor and a negative output end of the comparator, the gate of the first field effect transistor is connected to a gate of the third field effect transistor through the first switch, the gate of the second field effect transistor is connected to a gate of the fourth field effect transistor through the second switch, a drain of the third field effect transistor is connected to the gate of the second field effect transistor, a drain of the fourth field effect transistor is connected to the gate of the first field effect transistor, the gate of the third field effect transistor receives the third differential voltage signal, and the gate of the fourth field effect transistor receives the fourth differential voltage signal; and the first switch and the second switch are closed when a first clock signal is a first level signal, and are open when a second clock signal is a first level signal, wherein when the first clock signal is a first level signal, the second clock signal is a second level signal, and when the second clock signal is a first level signal, the first clock signal is a second level signal.

2. The comparator according to claim 1, wherein the coupling module comprises a first capacitor and a second capacitor; the first capacitor is configured to receive and transmit the third differential voltage signal; and the second capacitor is configured to receive and transmit the fourth differential voltage signal.

3. The comparator according to claim 1, wherein the pre-amplifying module is specifically configured to:
convert and amplify the first differential voltage signal to obtain a first differential current signal, and convert and amplify the first differential current signal to obtain the third differential voltage signal; and convert and amplify the second differential voltage signal to obtain a second differential current signal, and convert and amplify the second differential current signal to obtain the fourth differential voltage signal.

4. The comparator according to claim 3, wherein the pre-amplifying module comprises a fifth field effect transistor, a sixth field effect transistor, a seventh field effect transistor, a first resistor, and a second resistor, wherein the fifth field effect transistor, the sixth field effect transistor, and the seventh field effect transistor are all N-type field effect transistors; and
a gate of the seventh field effect transistor receives a first bias voltage, a source of the seventh field effect transistor is grounded, a drain of the seventh field effect transistor is separately connected to a source of the fifth field effect transistor and a source of the sixth field effect transistor, a gate of the fifth field effect transistor receives the first differential voltage signal, and a gate of the sixth field effect transistor receives the second differential voltage signal; a drain of the fifth field effect transistor is connected to one end of the first resistor, and the other end of the first resistor receives the device working voltage signal; a drain of the sixth field effect transistor is connected to one end of the second resistor, and the other end of the second resistor receives the device working voltage signal; and the drain of the fifth field effect transistor outputs the first differential current signal, the drain of the sixth field effect transistor outputs the second differential current signal, the first resistor is configured to convert the first differential current signal to the third differential voltage signal, and the second resistor is configured to convert the second differential current signal to the fourth differential voltage signal.

5. The comparator according to claim 3, wherein the pre-amplifying module comprises an eighth field effect transistor, a ninth field effect transistor, a tenth field effect transistor, a third resistor, and a fourth resistor, wherein the eighth field effect transistor, the ninth field effect transistor, and the tenth field effect transistor are all P-type field effect transistors; and
a gate of the tenth field effect transistor receives a second bias voltage, a source of the tenth field effect transistor receives the device working voltage signal, a drain of the tenth field effect transistor is separately connected to a source of the eighth field effect transistor and a source of the ninth field effect transistor, a gate of the eighth field effect transistor receives the first differential voltage signal, and a gate of the ninth field effect transistor receives the second differential voltage signal; a drain of the eighth field effect transistor is connected to one end of the third resistor, and the other end of the third resistor is grounded; a drain of the ninth field effect transistor is connected to one end of the fourth resistor, and the other end of the fourth resistor is grounded; and the drain of the eighth field effect transistor outputs the first differential current signal, the drain of the ninth field effect transistor outputs the second differential current signal, the third resistor is configured to convert the first differential current signal to the third differential voltage signal, and the fourth resistor is configured to convert the second differential current signal to the fourth differential voltage signal.

6. The comparator according to claim 1, wherein the comparator further comprises a third switch and a fourth switch, wherein:
the third switch is configured to transmit the third differential voltage signal, which is transmitted by the coupling module, to one end that is in the first switch and is not connected to the positive output end of the comparator;
the fourth switch is configured to transmit the fourth differential voltage signal, which is transmitted by the coupling module, to one end that is in the second switch and is not connected to the negative output end of the comparator; and
the third switch and the fourth switch start to close at a start moment of a period during which the first clock signal is a first level signal, and are open before an end moment of the period during which the first clock signal is a first level signal.

7. The comparator according to claim 6, wherein the comparator further comprises a fifth switch, a sixth switch, a seventh switch, and an eighth switch, wherein:
one end of the fifth switch is connected, through the third switch, to the end that is in the first switch and is not connected to the positive output end of the comparator, and the other end of the fifth switch receives a first preset voltage signal; one end of the sixth switch is connected, through the fourth switch, to the end that is in the second switch and is not connected to the negative output end of the comparator, and the other end of the sixth switch receives the first preset voltage signal; and the fifth switch and the sixth switch are closed when the first clock signal is a first level signal, and are open when the second clock signal is a first level signal;
one end of the seventh switch is connected to the end that is in the first switch and is not connected to the positive output end of the comparator, and the other end of the seventh switch receives the first preset voltage signal; and one end of the eighth switch is connected to the end that is in the second switch and is not connected to the negative output end of the comparator, and the other end of the eighth switch receives the first preset voltage signal; and
the seventh switch and the eighth switch are closed when a third clock signal is a first level signal, and are open when the third clock signal is a second level signal; and when the first clock signal is a first level signal or the second clock signal is a first level signal, the third clock signal is a second level signal, and after the end moment of the period during which the first clock signal is a first level signal and before a start moment of a period during which the second clock signal is a first level signal, the third clock signal is a first level signal.

8. The comparator according to claim 6, wherein the comparator further comprises a ninth switch, a tenth switch, an eleventh switch, and a twelfth switch, wherein:
one end of the ninth switch is connected, through the third switch, to the end that is in the first switch and is not connected to the positive output end of the comparator, and the other end of the ninth switch receives a second preset voltage signal; one end of the tenth switch is connected, through the fourth switch, to the end that is in the second switch and is not connected to the negative output end of the comparator, and the other end of the tenth switch receives a third preset voltage signal;
a difference between the third preset voltage signal and the second preset voltage signal is an offset voltage introduced by the first field effect transistor, the second field effect transistor, the third field effect transistor, and the fourth field effect transistor; the ninth switch and the tenth switch are closed when the first clock signal is a first level signal, and are open when the second clock signal is a first level signal;

one end of the eleventh switch is connected to the end that is in the first switch and is not connected to the positive output end of the comparator, and the other end of the eleventh switch receives a fourth preset voltage signal; one end of the twelfth switch is connected to the end that is in the second switch and is not connected to the negative output end of the comparator, and the other end of the twelfth switch receives the fourth preset voltage signal; the fourth preset voltage signal is half of a sum of the third preset voltage signal and the second preset voltage signal; and the eleventh switch and the twelfth switch are closed when a fourth clock signal is a first level signal, and are open when the fourth clock signal is a second level signal, wherein when the first clock signal is a first level signal or the second clock signal is a first level signal, the fourth clock signal is a second level signal; and after the end moment of the period during which the first clock signal is a first level signal and before a start moment of a period during which the second clock signal is a first level signal, the fourth clock signal is a first level signal.

9. The comparator according to claim 1, wherein the comparator further comprises a thirteenth switch, wherein one end of the thirteenth switch is connected to one end that is in the first switch and is not connected to the positive output end of the comparator, the other end of the thirteenth switch is connected to one end that is in the second switch and is not connected to the negative output end of the comparator, and the thirteenth switch is closed when the first clock signal is a first level signal.

10. The comparator according to claim 1, wherein the sampling module is specifically configured to:

when the first clock signal is a first level signal, collect the positive reference signal and the negative reference signal; when the second clock signal is a first level signal, collect the positive input signal and the negative input signal; obtain the first differential voltage signal according to a voltage of the collected positive input signal and a voltage of a last negative reference signal that is collected before the positive input signal is collected; and obtain the second differential voltage signal according to a voltage of the collected negative input signal and a voltage of a last positive reference signal that is collected before the negative input signal is collected.

11. The comparator according to claim 10, wherein the sampling module comprises a fourteenth switch, a fifteenth switch, a sixteenth switch, a seventeenth switch, an eighteenth switch, a third capacitor, and a fourth capacitor, wherein:

one end of the fourteenth switch receives the positive reference signal, one end of the fifteenth switch receives the negative reference signal, one end of the sixteenth switch receives the positive input signal, one end of the seventeenth switch receives the negative input signal, the other end of the fourteenth switch and the other end of the seventeenth switch both are connected to one end of the fourth capacitor, the other end of the fifteenth switch and the other end of the sixteenth switch both are connected to one end of the third capacitor, and the other end of the third capacitor is connected to the other end of the fourth capacitor through the eighteenth switch; one end that is of the third capacitor and is connected to the eighteenth switch outputs the first differential voltage signal, and one end that is of the fourth capacitor and is connected to the eighteenth switch outputs the second differential voltage signal; and the fourteenth switch, the fifteenth switch, and the eighteenth switch are closed when the first clock signal is a first level signal, and the sixteenth switch and the seventeenth switch are closed when the second clock signal is a first level signal.

12. The comparator according to claim 1, wherein the comparator further comprises a first phase inverter and a second phase inverter, wherein:

one end that is in the first switch and is connected to the positive output end of the comparator is connected to the positive output end of the comparator through the first phase inverter, and one end that is in the second switch and is connected to the negative output end of the comparator is connected to the negative output end of the comparator through the second phase inverter.

13. An analog-to-digital converter, comprising the comparator according to claim 1.

* * * * *